US009906000B2

(12) United States Patent
Kono et al.

(10) Patent No.: US 9,906,000 B2
(45) Date of Patent: Feb. 27, 2018

(54) SEMICONDUCTOR LASER APPARATUS ASSEMBLY

(71) Applicant: Sony Corporation, Tokyo (JP)

(72) Inventors: Shunsuke Kono, Kanagawa (JP); Masaru Kuramoto, Kanagawa (JP); Takao Miyajima, Kanagawa (JP); Rintaro Koda, Tokyo (JP); Hideki Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/355,797

(22) PCT Filed: Nov. 9, 2012

(86) PCT No.: PCT/JP2012/007207
§ 371 (c)(1),
(2) Date: May 1, 2014

(87) PCT Pub. No.: WO2013/069301
PCT Pub. Date: May 16, 2013

(65) Prior Publication Data
US 2014/0307750 A1  Oct. 16, 2014

(30) Foreign Application Priority Data
Nov. 11, 2011  (JP) ................. 2011-247276

(51) Int. Cl.
*H01S 3/098* (2006.01)
*H01S 5/14* (2006.01)
(Continued)

(52) U.S. Cl.
CPC .............. *H01S 5/141* (2013.01); *B82Y 20/00* (2013.01); *H01S 5/0657* (2013.01); *H01S 5/143* (2013.01);
(Continued)

(58) Field of Classification Search
CPC ........ H01S 5/141; H01S 5/143; H01S 5/0657; H01S 3/1062; H01S 3/106;
(Continued)

(56) References Cited

U.S. PATENT DOCUMENTS 6,363,090 B1* 3/2002 Wintner et al. ................ 372/21
6,795,479 B2* 9/2004 Yokoyama ..................... 372/97
(Continued)

FOREIGN PATENT DOCUMENTS

CN      102195232      9/2011
JP      09-199777      7/1997
(Continued)

OTHER PUBLICATIONS

Tobias Schlauch et al: "Femtosecond passively modelocked diode laser with intracavity dispersion management", Optics Express, vol. 18, No. 23, Nov. 8, 2010, pp. 24316-24324. (9 pages).
(Continued)

*Primary Examiner* — Yuanda Zhang
(74) *Attorney, Agent, or Firm* — K&L Gates LLP

(57) ABSTRACT

A semiconductor laser apparatus is provided. The semiconductor laser apparatus includes a mode-locked semiconductor laser device and an external resonator including a dispersion compensation system, wherein the semiconductor laser apparatus is configured to generate self modulation, to introduce a negative group velocity dispersion into the external resonator, and to provide spectral filtering after the external resonator.

20 Claims, 21 Drawing Sheets

(51) Int. Cl.

| | | |
|---|---|---|
| *H01S 5/065* | (2006.01) | |
| *B82Y 20/00* | (2011.01) | |
| *H01S 5/343* | (2006.01) | |
| *H01S 3/08* | (2006.01) | |
| *H01S 3/105* | (2006.01) | |
| *H01S 3/106* | (2006.01) | |
| *H01S 5/00* | (2006.01) | |
| *H01S 5/026* | (2006.01) | |
| *H01S 5/10* | (2006.01) | |
| *H01S 5/22* | (2006.01) | |
| *H01S 5/32* | (2006.01) | |
| *H01S 5/30* | (2006.01) | |

(52) U.S. Cl.
CPC ....... *H01S 3/08004* (2013.01); *H01S 3/08009* (2013.01); *H01S 3/105* (2013.01); *H01S 3/106* (2013.01); *H01S 3/1062* (2013.01); *H01S 5/0014* (2013.01); *H01S 5/0265* (2013.01); *H01S 5/101* (2013.01); *H01S 5/22* (2013.01); *H01S 5/3063* (2013.01); *H01S 5/3216* (2013.01); *H01S 5/34333* (2013.01)

(58) Field of Classification Search
CPC ...... H01S 3/08004; H01S 5/22; H01S 5/3063; H01S 5/0265; H01S 5/101; H01S 3/105; H01S 3/08009; H01S 5/0014; H01S 5/3216; H01S 5/34333; B82Y 20/00
USPC .................................. 372/11, 18, 20
See application file for complete search history.

(56) References Cited

U.S. PATENT DOCUMENTS

| | | | |
|---|---|---|---|
| 2004/0190567 A1 | 9/2004 | Lutgen et al. | |
| 2005/0220154 A1* | 10/2005 | Uemura et al. | 372/18 |
| 2008/0260319 A1* | 10/2008 | Taira et al. | G02F 1/011 385/1 |
| 2009/0086771 A1* | 4/2009 | Usui et al. | 372/18 |
| 2011/0206071 A1* | 8/2011 | Karavitis | 372/25 |
| 2011/0216788 A1 | 9/2011 | Oki | |
| 2012/0099185 A1* | 4/2012 | Yokoyama et al. | 359/340 |
| 2013/0003761 A1* | 1/2013 | MacGillivray et al. | H01S 3/07 372/18 |

FOREIGN PATENT DOCUMENTS

| | | | |
|---|---|---|---|
| JP | 10-039154 | 2/1998 | |
| JP | 2000-332341 | 11/2000 | |
| JP | 2006-229080 | 8/2006 | |
| JP | 2009-026834 | 2/2009 | |
| JP | 2009049310 A * | 3/2009 | ............ H01S 5/343 |
| JP | 2009-258235 | 11/2009 | |
| JP | 2010-034252 | 2/2010 | |
| JP | 2011-018779 | 1/2011 | |

OTHER PUBLICATIONS

Delfyett, P J et al., "Generation of high-power femtosecond optical pulses from a semiconductor diode laser system", OSA Picosecond Electronics and Optoelectronics, 1991, pp. 185-187. (3 pages).

Kono Shunsuke et al: "200-fs pulse generation from a GaInN semiconductor laser diode passively mode-locked in a dispersion-compensated external cavity", Applied Physics Letters, AIP, American Institute of Physics, Melville, NY, US, vol. 101, No. 8, Aug. 20, 2012, pp. 81121-81121.

Chinese Office Action issued Jan. 21, 2016 in corresponding Chinese Application No. 201280054166.0.

Japanese Office Action issued Nov. 4, 2015 in corresponding Japanese Application No. 2011247276.

Koda et al., 100 W peak-power 1 GHz repetition picoseconds optical pulse generation using blue-violet GaInN diode laser mode-locked oscillator and optical amplifier, Applied Physics Letters 97, 021101 (2010).

Chinese Office Action dated Aug. 12, 2016 in corresponding Chinese Application No. 201280054166.0.

Schlauch, et al., Femtosecond passively modelocked diode laser with intracavity dispersion management, Optics Express 24316, vol. 18, No. 23, Nov. 8, 2010.

* cited by examiner

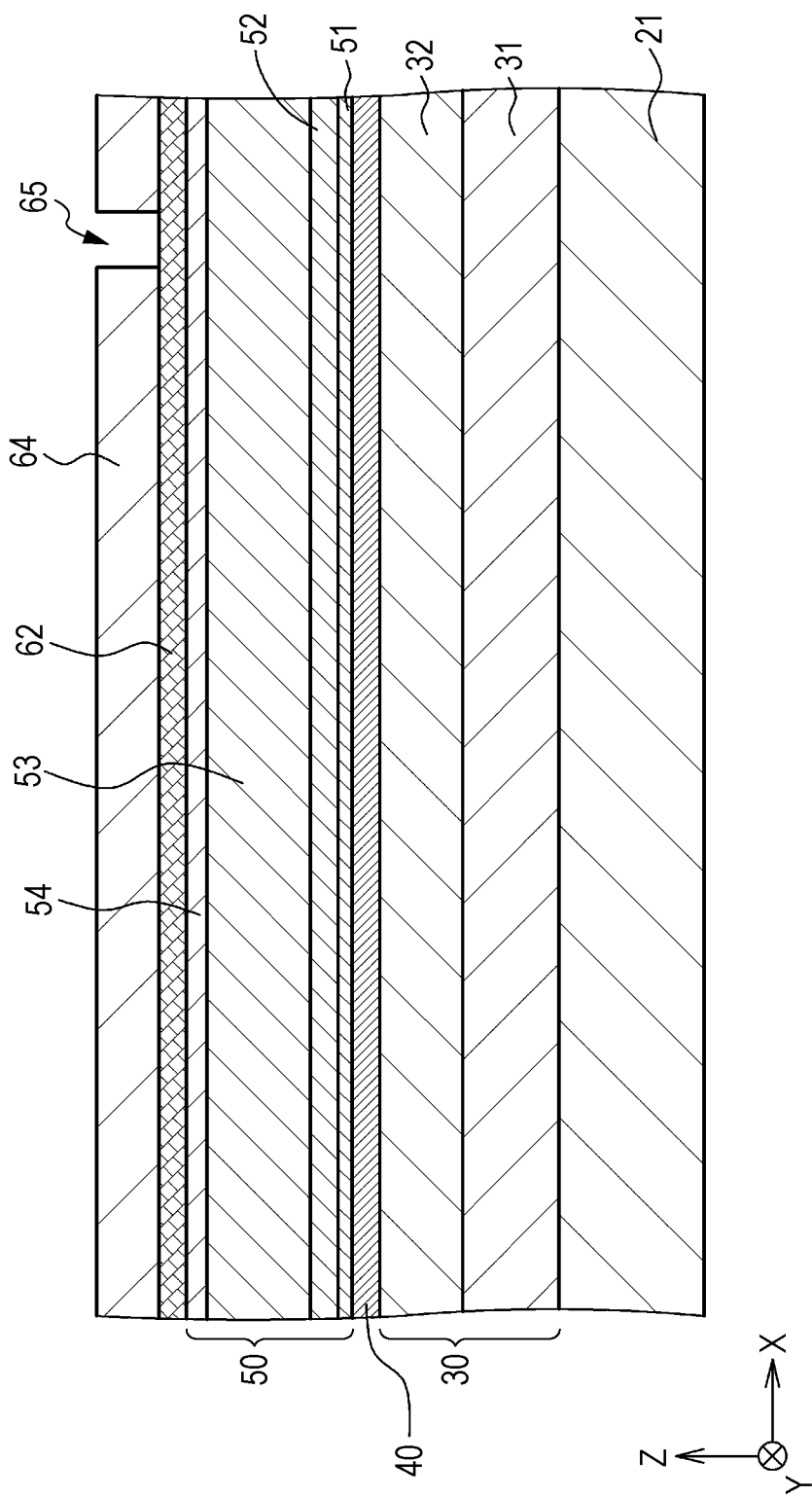

SEMICONDUCTOR LASER APPARATUS ASSEMBLY

CROSS REFERENCES TO RELATED APPLICATIONS

The present application is a national stage of International Application No. PCT/JP2012/007207 filed on Nov. 9, 2012 and claims priority to Japanese Patent Application No. 2011-247276 filed on Nov. 11, 2011, the disclosure of which is incorporated herein by reference.

BACKGROUND

The present invention relates to a semiconductor laser apparatus assembly having a semiconductor laser device and a dispersion compensation optical system.

BACKGROUND ART

In recent years, an ultrashort pulse and ultrahigh output laser, which uses laser light of which a pulse time width is in attoseconds or femtoseconds has been increasingly used in advanced scientific research. In addition, the ultrashort pulse laser has attracted scientific attention in relation to solving of ultrahigh speed phenomena in picoseconds or femtoseconds, and using a high peak power and has been actively studied for its application to practical uses such as fine processing or two-photon imaging. Further, high output ultrashort pulse semiconductor laser devices which are formed of GaN based compound semiconductors and have an emission wavelength of around 405 nm are expected to be used as a light source of a volume type optical disc system which is expected to be used as an optical disc system of the next generation to the Blu-ray optical system, as a light source which is necessary in a medical field or a bio imaging field, and a coherent light source which covers the whole visible light range.

As the ultrashort pulse and unitrahigh output laser, for example, a titanium/sapphire laser is known; however, the facts that the related titanium/sapphire laser is expensive and that a large-sized solid-state laser light source, are the main factors hindering the technique from becoming widespread. In addition, other solid-state lasers for oscillating continuous light are required for excitation, and thus the energy efficiency is not necessarily high. Further, a large-sized resonator is not easy to mechanically stabilize and requires exclusive knowledge in terms of maintenance. If the ultrashort pulse and ultrahigh output laser is realized using a semiconductor laser device, this leads to a very small size, low price, low power consumption, and high stability and thereby may be a breakthrough in prompting extensive spread in these fields.

CITATION LIST

Non-Patent Literature

NPL 1: T. Schlauch et al., Optics Express, Vol. 18, p 24136 (2010)

SUMMARY

Technical Problem

As a method of generating light pulses having a time width of approximately several picoseconds using a semiconductor laser device, a mode locking method is known. The mode locking method includes active mode locking in which gain or loss is modulated at the same cycle as the lap time in a resonator and passive mode locking in which a saturable absorber showing a nonlinear optical response is provided in the semiconductor laser device and is operated, and the passive mode locking is suitable to generate light pulses with a pulse time width of about several picoseconds or less.

In a case where energy is the same per pulse, peak power of light pulses is higher as the pulse time width becomes smaller, and a targeted nonlinear phenomenon is notably shown. Therefore, one of the performance indices of the ultrashort light pulse light source may be the small pulse time width. A titanium/sapphire laser of the passive mode locking which generates light pulses with a pulse time width of about 10 femtoseconds is available in the market. In contrast, in a passive mode-locked semiconductor laser device, the pulse time width of a current injection type quantum well laser is generally about 1 picosecond to 2 picoseconds. Since the semiconductor laser device has a sufficiently wide gain band, it has a latent performance capable of generating light pulses of subpicoseconds, but an example of reporting the generation of light pulses of subpicoseconds is all but unknown.

In driving of a semiconductor laser device based on the mode locking method, a main factor which hinders generation of light pulses with a pulse time width of subpicoseconds or less may include chirping given to the light pulses according to the generation of the pulses. In the semiconductor laser device, a carrier density in an active layer (gain portion) varies temporally according to the pulse generation, and, as a result, a refractive index of the active layer varies. For this reason, the frequency of the light pulses generated in the semiconductor laser device varies within the duration of the pulses. The frequency variation is called chirping, and if the chirping is strong, it is difficult to align phases of the respective frequencies of the light pulses circling the inside of a resonator and to decrease the pulse time width.

In order to solve the problem that it is difficult to decrease the pulse time width due to such chirping, there is a method of providing a dispersion compensation optical system in an external resonator. This method is used in a mode-locked titanium/sapphire laser in many cases, but there are very few reported examples in a mode-locked semiconductor laser device. This method does not depend on a gain medium or the type of saturable absorber, or an excitation method, and thus has a wide application range and is advantageous. NPL 1 "T. Schlauch et al., Optics Express, Vol. 18, p 24136 (2010)" reports an attempt to restrict the pulse time width of light pulses generated from the mode-locked semiconductor laser with a dispersion compensation optical system using a diffraction grating. Here, NPL 1 reports that spectra of the generated light pulses vary depending on a dispersion compensation amount, but the pulse time width does not vary, and generation of light pulses of a pulse time width of picoseconds or less is not reached.

Therefore, an object of the present disclosure is to provide a current injection type semiconductor laser apparatus assembly having a configuration and a structure capable of outputting ultrashort pulse laser light.

Solution to Problem

A semiconductor laser apparatus related to one aspect of the present disclosure includes a mode-locked semiconductor laser device and an external resonator including a dispersion compensation system, wherein the semiconductor laser apparatus is configured to generate self modulation, to introduce a negative group velocity dispersion into the external resonator, and to provide spectral filtering after the external resonator.

A method of generating an optical pulse related to another aspect of the present disclosure includes providing a semiconductor laser apparatus including a mode-locked semiconductor laser device, an external resonator, and a dispersion compensation optical system in the external resonator; and generating the optical pulse by utilizing the semiconductor laser apparatus to generate self modulation, to introduce a negative group velocity dispersion into the external resonator, and to provide spectral filtering after the external resonator.

A semiconductor laser apparatus assembly related to a another aspect of the present disclosure for achieving the above object includes a current injection type mode-locked semiconductor laser device of which a light density is $1 \times 10^{10}$ watts/cm$^2$ or more, and, preferably, $1.4 \times 10^{10}$ watts/cm$^2$ or more, and a carrier density is $1 \times 10^{19}$/cm$^3$ or more; and a dispersion compensation optical system to and from which laser light emitted from the mode-locked semiconductor laser device is incident and is emitted.

A semiconductor laser apparatus assembly related to another aspect of the present disclosure for achieving the above object includes a current injection type mode-locked semiconductor laser device; and a dispersion compensation optical system to and from which laser light emitted from the mode-locked semiconductor laser device is incident and is emitted, wherein, when a group velocity dispersion of the dispersion compensation optical system monotonously varies from a first predetermined value GVD$_1$ to a second predetermined value GVD$_2$ (where |GVD$_1$|<|GVD$_2$|), a pulse time width of laser light output to the outside of the system from the mode-locked semiconductor laser device is reduced and is then increased exceeding the minimum value PW$_{min}$. In addition, the monotonous variation indicates a monotonous increase in a case of GVD$_1$<GVD$_2$, and indicates a monotonous decrease in a case of GVD$_1$>GVD$_2$.

Advantageous Effects of Invention

In the semiconductor laser device, when the light power density and the carrier density of the active layer (gain portion) in the semiconductor laser device exceed a specific value, the carriers are consumed due to inductive emission, and, as a result, a refractive index of the active layer dynamically varies and an oscillation spectrum is spread. This phenomenon is called self-phase modulation. Since an increase in the oscillation spectrum width due to self-phase modulation contributes to a decrease in the pulse time width, appropriate group velocity dispersion is given to self-phase modulation by the dispersion compensation optical system so as to obtain an appropriate spectrum width, thereby generating light pulses of subpicoseconds. This characteristic is similar to features of soliton mode locking which can be found when self-phase modulation and the appropriate group velocity dispersion interact with each other in a resonator, and is thus considerably effective as a method of decreasing a time width of the generated light pulse to the subpicoseconds (for example, 200 femtoseconds) or less.

In the semiconductor laser apparatus assembly related to the first aspect of the present disclosure, since a light density of laser light emitted from the mode-locked semiconductor laser device is regulated, and a value of the carrier density in the mode-locked semiconductor laser device is regulated, self-phase modulation is generated at a high light power density and a high carrier density, and appropriate group velocity dispersion is given thereto, thereby reliably generating light pulses of subpicoseconds. In addition, in the semiconductor laser apparatus assembly related to the second aspect of the present disclosure, since a relationship between a group velocity dispersion of the dispersion compensation optical system and a pulse time width of laser light output to the outside of the system from the mode-locked semiconductor laser device is defined, stable light pulses of subpicoseconds can be reliably generated, and noise can be reduced in the generated light pulses. Furthermore, in addition to the decrease in the light pulse time width of the light pulses of the subpicoseconds, in the semiconductor laser apparatus assembly of the present disclosure, the mode-locked semiconductor laser device is of a current injection type and thus has an advantage in that the energy efficiency is high as compared with a photoexcitation type mode-locked semiconductor laser device.

Additional features and advantages are described herein, and will be apparent from the following Detailed Description and the figures.

BRIEF DESCRIPTION OF THE FIGURES

FIG. 20 follows FIG. 19B and is a schematic partial cross-sectional view of the substrate and the like for describing the manufacturing method of the mode-locked semiconductor laser device according to Embodiment 1.

DETAILED DESCRIPTION

Figure 1:
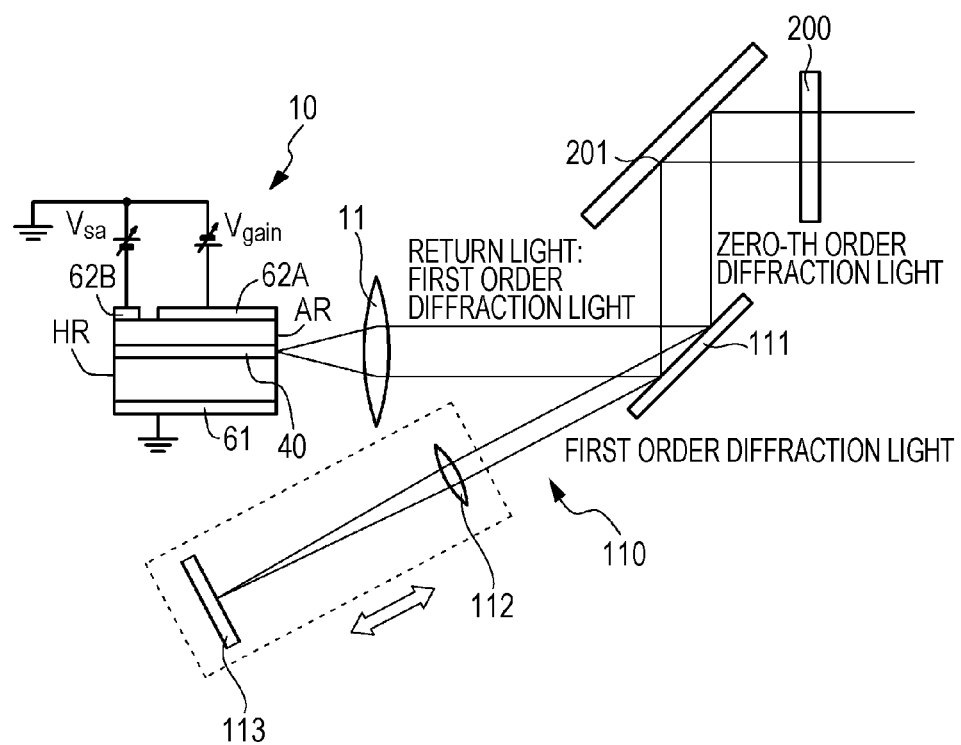
FIG. 1 is a conceptual diagram of a semiconductor laser apparatus assembly according to Embodiment 1.

Hereinafter, the present disclosure is described based on embodiments with reference to the drawings, but the present disclosure is not limited to the embodiments, and various numerical values or materials in the embodiments are examples. In addition, the description will be made in the following order.

1. Description of Overall Semiconductor Laser Apparatus Assembly Related to First Aspect and Second Aspect of Present Disclosure 2. Embodiment 1 (the semiconductor laser apparatus assembly related to the first aspect and the second aspect of the present disclosure)

3. Embodiment 2 (a modification of Embodiment 1)

4. Embodiment 3 (a modification of Embodiment 1)

5. Embodiment 4 (modifications of Embodiment 1 to Embodiment 3) and others

[Description of Overall Semiconductor Laser Apparatus Assembly Related to First Aspect and Second Aspect of Present Disclosure]

In a semiconductor laser apparatus assembly related to a second aspect of the present disclosure, if a minimum group velocity dispersion of a dispersion compensation optical system when a pulse time width of laser light output to the outside of the system becomes the minimum value $PW_{min}$ is $GVD_{min}$, a pulse time width of the laser light when a group velocity dispersion of the dispersion compensation optical system is a negative first predetermined value $GVD_1$, is $PW_1$, and a pulse time width of the laser light when a group velocity dispersion of the dispersion compensation optical system is a negative second predetermined value $GVD_2$ is $PW_2$, for example, the following is preferably satisfied.

$(PW_1-PW_{min})/|GVD_{min}-GVD_1| \geq 2\times(PW_2-PW_{min})/|GVD_2-GVD_{min}|$ where $|GVD_1/GVD_{min}|=0.5$ and $|GVD_2/GVD_{min}|=2$ The semiconductor laser apparatus assembly related to the second aspect of the present disclosure including the above preferred form is preferably operated at the minimum group velocity dispersion $GVD_{min}$ where a pulse time width of laser light output to the outside of the system is the minimum value $PW_{min}$, or at the vicinity thereof. As described later, a group velocity dispersion is decreased (an absolute value of the group velocity dispersion is increased) and simultaneously the number of sub-pulses other than a main pulse at the time zero is decreased, but if an upper limit value of the group velocity dispersion when the sub-pulses are not observed is $GVD_S$, the "vicinity of the minimum group velocity dispersion $GVD_{min}$" is defined as $GVD_S \pm |GVD_{min}-GVD_S|$.

In addition, in the semiconductor laser apparatus assembly related to the second aspect of the present disclosure including the above-described preferred form, a noise component of laser light output to the outside of the system to a main oscillation frequency may be −60 dB or less, and, preferably, −70 dB or less.

In the semiconductor laser apparatus assembly related to the first aspect of the present disclosure, or, in the semiconductor laser apparatus assembly related to the second aspect of the present disclosure including the above-described preferred form, the mode-locked semiconductor laser device may include a saturable absorption region. In addition, the photoexcitation type mode-locked semiconductor laser device in the related art uses temperature characteristics of a semiconductor saturable absorber (SESAME) for controlling oscillation characteristics, but, in the form of providing the saturable absorption region, the oscillation characteristics can be controlled based on a reverse bias voltage to the saturable absorption region and a group velocity dispersion of the dispersion compensation optical system, and thus it is easy to control the oscillation characteristics. In addition, in this case, the mode-locked semiconductor laser device may be configured to have a laminate structure formed by sequentially laminating a first compound semiconductor layer made of a GaN based compound semiconductor and having a first conductivity type; a third compound semiconductor layer (active layer) made of the GaN based compound semiconductor; and a second compound semiconductor layer made of the GaN based compound semiconductor and having a second conductivity type different from the first conductivity type.

In addition, in this case, a group velocity dispersion in the dispersion compensation optical system preferably has a negative value. Here, the group velocity dispersion may be determined as a whole based on a configuration and a structure of the mode-locked semiconductor laser device, or a configuration, a structure and a driving method of the semiconductor laser apparatus assembly (for example, a current amount applied to a carrier injection region (gain region), a reverse bias voltage applied to the saturable absorption region (carrier non-injection region), and driving temperature), or may be a positive value depending on a configuration and a structure of the mode-locked semiconductor laser device, a configuration, a structure, a driving method, and the like of the semiconductor laser apparatus assembly.

In addition, the semiconductor laser apparatus assembly related to the first aspect of the present disclosure including the above-described preferred configuration is preferably operated at a group velocity dispersion where a pulse time width of laser light output to the outside of the system is the minimum value, or at the vicinity thereof. Further, the "vicinity of the group velocity dispersion" is the same meaning as the vicinity of the above-described minimum group velocity dispersion $GVD_{min}$.

In addition, the semiconductor laser apparatus assembly related to the first aspect or the second aspect of the present disclosure including the above-described preferred form and configuration includes wavelength selecting means (wavelength selecting device), and the wavelength selecting means (wavelength selecting device) may be configured to extract a short wavelength component of laser light output to the outside of the system.

Here, the wavelength selecting means may be constituted by a band-pass filter, or may be constituted by a long-pass filter or a prism, or, alternatively, may be constituted by a diffraction grating and an aperture which selects first order or more diffracted light emitted from the diffraction grating. The aperture may be constituted by a transmissive liquid crystal display device having a plurality of segments. The band-pass filter may be obtained by laminating a dielectric thin film having a low dielectric constant and a dielectric thin film having a high dielectric constant. In addition, if an incidence angle of the pulse-shape laser light to the band-pass filter is changed, a wavelength of the laser light emitted from the band-pass filter can be selected.

In addition, in the semiconductor laser apparatus assembly related to the first aspect or the second aspect of the present disclosure including the above-described preferred form and configuration, there may be a configuration in which laser light emitted from the mode-locked semiconductor laser device is incident to the dispersion compensation optical system, and a portion of the laser light incident to the dispersion compensation optical system is emitted from the dispersion compensation optical system and returns to the mode-locked semiconductor laser device, and the remainder of the laser light incident to the dispersion compensation optical system is output to the outside of the system.

In this form, an external resonator structure is constituted by the dispersion compensation optical system. Specifically, the dispersion compensation optical system may be constituted by a diffraction grating, condensing means (specifically, a lens) and a reflection mirror (a plane reflection mirror, specifically, for example, a dielectric multilayer film reflection mirror). The diffraction grating may cause first order or more diffracted light of pulse-shaped laser light emitted from the mode-locked semiconductor laser device to be incident to the dispersion compensation optical system such that 0-th order diffracted light is output to the outside of the system. Here, collimating means (specifically, a lens) for generating parallel light fluxes of laser light from the mode-locked semiconductor laser device may be disposed between the mode-locked semiconductor laser device and the diffraction grating. The number of patterns of a grid in the diffraction grating included in the laser light which is incident to (impacted on) the diffraction grating may be, for example, 1200/mm to 3600/mm, and, preferably, 2400/mm to 3600/mm. One end of a so-called external resonator is constituted by a reflection mirror. In addition, the pulse-shaped laser light emitted from the mode-locked semiconductor laser device is impacted on the diffraction grating, and first order or more diffracted light is incident to the condensing means, is reflected by the reflection mirror, and returns to the mode-locked semiconductor laser device via the condensing means and the diffraction grating. In addition, 0-th order diffracted light is output to the outside of the system. If a distance between the diffraction grating and the condensing means is changed in a state of fixing a distance between the condensing means and the reflection mirror, a group velocity dispersion in the dispersion compensation optical system can be changed.

Alternatively, in this form, the external resonator structure is constituted by the dispersion compensation optical system and a partial reflection mirror (also referred to as a partial transmission mirror, a half transmission mirror, or a half mirror). In addition, specifically, the dispersion compensation optical system may be constituted by a pair of diffraction gratings. In this case, the pulse-shaped laser light emitted from the mode-locked semiconductor laser device is impacted on the first diffraction grating so as to emit first order or more diffracted light which is then impacted on the second diffraction grating so as to emit first order or more diffracted light and arrives at the partial reflection mirror. In addition, a portion of the laser light arriving at the partial reflection mirror passes through the partial reflection mirror and is output to the outside of the system. On the other hand, the remainder of the laser light impacted on the partial reflection mirror returns to the mode-locked semiconductor laser device via the second diffraction grating and the first diffraction grating. If a distance between the first diffraction grating and the second diffraction grating is changed, a group velocity dispersion in the dispersion compensation optical system can be changed. Alternatively, the dispersion compensation optical system may be constituted by a pair of prisms. In this case, the pulse-shaped laser light emitted from the mode-locked semiconductor laser device passes through the first prism, further passes through the second prism, and then arrives at the partial reflection mirror. In addition, a portion of the laser light arriving at the partial reflection mirror passes through the partial reflection mirror and is output to the outside of the system. On the other hand, the remainder of the laser light arriving at the partial reflection mirror returns to the mode-locked semiconductor laser device via the second prism and the first prism. If a distance between the first prism and the second prism is changed, a group velocity dispersion in the dispersion compensation optical system can be changed. Alternatively, the dispersion compensation optical system may be constituted by an interferometer. Specifically, the interferometer may include, for example, a Gires-Tournois type interferometer. The Gires-Tournois type interferometer is constituted by a reflection mirror with a reflectance of 1 and a partial reflection mirror with a reflectance of below 1, is an interferometer which can change a phase without changing an intensity spectrum of reflected light, and can change a group velocity dispersion in the dispersion compensation optical system by controlling a distance between the reflection mirror and the partial reflection mirror, or, alternatively, by adjusting an incidence angle of incident light. Alternatively, the dispersion compensation optical system may be constituted by a dielectric multilayer film mirror, and, in this case, a group velocity dispersion in the dispersion compensation optical system can be changed by adjusting an incidence angle of incident light.

The light density of laser light emitted from the mode-locked semiconductor laser device can be obtained by dividing power (the unit is watt, and peak power in a case of pulses) of the laser light by the cross-sectional area (a region of $1/e^2$ with respect to a peak intensity) on a near field pattern at an end surface of the mode-locked semiconductor laser device. In addition, the carrier density can be obtained by measuring a carrier life and by multiplying the carrier life by a value which is obtained by dividing an injected current amount by the area of an electrode (for example, a first portion of a second electrode described later) of the gain portion. In addition, the group velocity dispersion can be obtained using a method of measuring variations in a pulse width which is shown after a measured light pulse is transmitted through a medium having an existing dispersion amount, or a frequency resolved optical gating (FROG). In addition, a pulse width of the time of about 1 picosecond or less can be measured using an SHG intensity correlation measurement device.

In the semiconductor laser apparatus assembly related to the first aspect or the second aspect including the above-described preferred forms and configurations (hereinafter, they are collectively simply referred to as "the semiconductor laser apparatus assembly and the like of the present disclosure" in some cases), the mode-locked semiconductor laser device may be constituted by a bi-section type mode-locked semiconductor laser device where an emission region and a saturable absorption region are arranged in parallel in the resonator direction, and the bi-section type mode-locked semiconductor laser device may include:

(a) a laminate structure formed by sequentially laminating a first compound semiconductor layer made of a GaN based compound semiconductor and having a first conductivity type; a third compound semiconductor layer (active layer) forming the emission region and the saturable absorption region made of the GaN based compound semiconductor; and a second compound semiconductor layer made of the GaN based compound semiconductor and having a second conductivity type different from the first conductivity type, (b) a second electrode that has a strip shape and is formed on the second compound semiconductor layer; and (c) a first electrode that is electrically connected to the first compound semiconductor layer, wherein the second electrode is separated into a first portion which causes a DC current to flow to the first electrode via the emission region so as to enter a forward bias state, and a second portion for applying an electric field to the saturable absorption region, by a separation groove.

In addition, electrical resistivity between the first portion and the second portion of the second electrode is $1 \times 10$ or more times the electrical resistivity between the second electrode and the first electrode, preferably, $1 \times 10^2$ or more times, and, more preferably, $1 \times 10^3$ or more times. In addition, such a mode-locked semiconductor laser device is referred to as a "mode-locked semiconductor laser device with the first configuration" for convenience. Alternatively, the electrical resistivity between the first portion and the second portion of the second electrode is $1 \times 10^2 \Omega$ or more, preferably, $1 \times 10^3 \Omega$ or more, and, more preferably, $1 \times 10^4 \Omega$ or more. In addition, such a mode-locked semiconductor laser device is referred to as a "mode-locked semiconductor laser device with the second configuration" for convenience.

In the mode-locked semiconductor laser device with the first configuration or the second configuration, a DC current flows to the first electrode from the first portion of the second electrode via the emission region so as to enter a forward bias state, and an electric field is applied to the saturable absorption region by applying a voltage between the first electrode and the second portion of the second electrode, thereby performing a mode locking operation.

In the mode-locked semiconductor laser device with the first configuration or the second configuration, electrical resistivity between the first portion and the second portion of the second electrode is ten or more times the electrical resistivity between the second electrode and the first electrode, or alternatively, $1 \times 10^2 \Omega$ or more, and thereby it is possible to reliably suppress a flow of leaked current from the first portion of the second electrode to the second portion. In other words, since a reverse bias voltage $V_{sa}$ applied to the saturable absorption region (carrier non-injection region) can be increased, it is possible to realize a mode locking operation having light pulses shorter than a pulse time width. In addition, such high electrical resistivity between the first portion and the second portion of the second electrode can be achieved simply by separating the second electrode into the first portion and the second portion using the separation groove.

In addition, in the mode-locked semiconductor laser device with the first configuration and the second configuration, the third compound semiconductor layer may have a quantum well structure including a well layer and a barrier layer, the thickness of the well layer may be 1 nm or more and 10 nm or less, and, preferably, 1 nm or more and 8 nm or less, and impurity doping concentration of the barrier layer may be $2 \times 10^{18}$ cm$^{-3}$ or more and $1 \times 10^{20}$ cm$^{-3}$ or less, and, preferably, $1 \times 10^{19}$ cm$^{-3}$ or more and $1 \times 10^{20}$ cm$^{-3}$ or less, which does not intend limitation. In addition, such a mode-locked semiconductor laser device is referred to as a "mode-locked semiconductor laser device with the third configuration" for convenience in some cases. In addition, if the quantum well structure is employed in the active layer, it is possible to realize a higher injected current amount than in a case of employing a quantum dot structure and to thereby easily obtain high output.

As such, the thickness of the well layer constituting the third compound semiconductor layer is regulated as 1 nm or more and 10 nm or less, and, further, the impurity doping concentration of the barrier layer constituting the third compound semiconductor layer is regulated as $2 \times 10^{18}$ cm$^{-3}$ or more and $1 \times 10^{20}$ cm$^{-3}$ or less, that is, the thickness of the well layer is made small and further carriers of the third compound semiconductor layer are increased, thereby it is possible to reduce influence of piezoelectric polarization, and thus it is possible to obtain a laser light source which can generate light pulses having a small pulse time width and having a unimodal where sub-pulse components are few. In addition, it is possible to achieve mode locking driving with a low reverse bias voltage and to generate a light pulse train synchronized with external signals (an electric signal and a light signal). The impurity doped in the barrier layer may be silicon (Si), but the present disclosure is not limited thereto, and, it may be oxygen (O) or the like.

Here, the mode-locked semiconductor laser device may be a semiconductor laser device having a ridge stripe type separate confinement heterostructure (SCH structure). Alternatively, it may be a semiconductor laser device having a tilt ridge stripe type separate confinement heterostructure. In other words, an axial line of the mode-locked semiconductor laser device and an axial line of the ridge stripe structure may be configured to intersect each other with a predetermined angle. Here, the predetermined angle θ may be, for example, 0.1 degrees≤θ≤10 degrees. The axial line of the ridge stripe structure is a straight line which connects a middle point of both ends of the ridge stripe structure at a light emission end surface (for convenience, referred to as a "second end surface" in some cases) to a middle point of both ends of the ridge stripe structure at an end surface (for convenience, referred to as a "first end surface") of the laminate structure opposite to the light emission end surface (the second end surface). In addition, the axial line of the mode-locked semiconductor laser device indicates an axial line perpendicular to the first end surface and the second end surface. A planar shape of the ridge stripe structure may be a straight line shape or a curved shape.

Alternatively, in the mode-locked semiconductor laser device, when a width of the ridge stripe structure at the second end surface is $W_2$, and a width of the ridge stripe structure at the first end surface is $W_1$, there may be a configuration of $W_1=W_2$ or $W_2>W_1$. In addition, $W_2$ may be equal to or more than 5 µm, and the upper limit value of $W_2$, which does not intend limitation, may be, for example, $4\times10^2$ µm. In addition, $W_1$ may be 1.4 µm to 2.0 µm. Each end portion of the ridge stripe structure may be constituted by a single line segment, or may be constituted by two or more line segments. In the former case, for example, a width of the ridge stripe structure may be increased monotonously and smoothly to the second end surface from the first end surface in a tapered shape. On the other hand, in the latter case, for example, a width of the ridge stripe structure may be first the same width and then be increased monotonously and smoothly to the second end surface from the first end surface in a tapered shape, or a width of the ridge stripe structure may be first increased and then be decreased after exceeding the maximum width to the second end surface from the first end surface.

In the mode-locked semiconductor laser device, light reflectance of the second end surface of the laminate structure which emits light beams (light pulses) is preferably 0.5% or less. Specifically, a low reflection coat layer may be formed on the second end surface. Here, the low reflection coat layer is constituted by a laminate structure of at least two kinds of layers selected from a group including, for example, a titanium oxide layer, a tantalum oxide layer, a zirconium oxide layer, a silicon oxide layer, and an aluminum oxide layer. In addition, a value of the light reflectance is considerably lower than that of light reflectance (typically, 5% to 10%) of one end surface of the laminate structure which emits light beams (light pulses) in a semiconductor laser device in the related art. Further, the first end surface has high reflectance of, for example, 85% or more, and preferably has high reflectance of 95% or more.

A value of the external resonator length (X', unit: mm) in the external resonator is $0<X'<1500$, and, preferably, $30 \leq X' \leq 500$.

Here, the external resonator is constituted by the first end surface of the mode-locked semiconductor laser device, and the reflection mirror or the partial reflection mirror which forms an external resonator structure, and the external resonator length is a distance between the first end surface of the mode-locked semiconductor laser device and the reflection mirror or the partial reflection mirror which forms the external resonator structure.

In the mode-locked semiconductor laser device, the laminate structure has a ridge stripe structure constituted by at least a part of the second compound semiconductor layer in the thickness direction; however, the ridge stripe structure may be constituted only by the second compound semiconductor layer, be constituted by the second compound semiconductor layer and the third compound semiconductor layer (active layer), or be constituted by the second compound semiconductor layer, the third compound semiconductor layer (active layer), and a part of the first compound semiconductor layer in the thickness direction.

In the mode-locked semiconductor laser device with the first configuration or the second configuration, a width of the second electrode 0.5 µm or more and 50 µm or less, and, preferably, 1 µm or more and 5 µm or less, a height of the ridge stripe structure is 0.1 µm or more and 10 µm or less, and, preferably, 0.2 µm or more and 1 µm or less, and a width of the separation groove which separates the second electrode into the first portion and the second portion is 1 µm or more and 50% or less of a resonator length (hereinafter, simply referred to as a "resonator length") in the mode-locked semiconductor laser device, and, preferably, 10 µm or more and 10% or less of the resonator length, which do not intend limitation. The resonator length may be, for example, 0.6 mm, and the present disclosure is not limited thereto. A distance (D) from the top face of a portion of the second compound semiconductor layer which is located further at the outside than both side surfaces of the ridge stripe structure to the third compound semiconductor layer (active layer) is preferably $1.0\times10^{-7}$ m (0.1 µm). By regulating the distance (D) as such, a saturable absorption region can be reliably formed at both sides (Y direction) of the third compound semiconductor layer. The upper limit of the distance (D) may be determined based on an increase in threshold value current, temperature characteristics, deterioration in a current increase rate in driving for a long period of time, and the like. In addition, in the following description, it is assumed that the longitudinal direction of the resonator is the X direction, and the thickness direction of the laminate structure is the Z direction.

Furthermore, in the mode-locked semiconductor laser device with the first configuration or the second configuration including the above-described preferred form, the second electrode may be constituted by a laminate structure of palladium layer/platinum layer where a palladium (Pd) single layer, a nickel (Ni) single layer, a platinum (Pt) single layer, and a palladium layer come into contact with the second compound semiconductor layer, or a laminate structure of palladium layer/nickel layer where a palladium layer comes into contact with the second compound semiconductor layer. In addition, when a lower metal layer is made of palladium and an upper metal layer is made of nickel, a thickness of the upper metal layer is 0.1 µm or more, and, preferably, 0.2 µm or more. Alternatively, the second electrode is preferably constituted by a palladium (Pd) single layer, and, in this case, a thickness thereof is 20 nm or more, and, preferably, 50 nm or more. Alternatively, the second electrode is preferably constituted by a laminate structure of a lower metal layer and an upper metal layer where a palladium (Pd) single layer, a nickel (Ni) single layer, a platinum (Pt) single layer, or the lower metal layer comes into contact with the second compound semiconductor layer (here, the lower metal layer is made of one kind of metal selected from a group including palladium, nickel and platinum, and the upper metal layer is made of a metal of which an etching rate when forming the separation groove in the second electrode in a step (D) described later is the same as an etching rate of the lower metal layer, substantially the same as that, or higher than the etching rate of the lower metal layer). An etchant when forming the separation groove in the second electrode in the step (D) described later is preferably aqua regia, nitric acid, sulfuric acid, hydrochloric acid, or a mixture of at least two kinds thereof (specifically, a mixture of nitric acid and sulfuric acid, or a mixture of sulfuric acid and hydrochloric acid).

In the mode-locked semiconductor laser device with the first configuration or the second configuration including the above-described preferred configurations and forms, a length of the saturable absorption region may be smaller than a length of the emission region. Alternatively, a length of the second electrode (a total length of the first portion and the second portion) may be smaller than a length of the third compound semiconductor layer (active layer). Disposition states of the first portion and the second portion of the second electrode may include, specifically, (1) a state where a single first portion of the second electrode and a single second portion of the second electrode are provided, and the first portion of the second electrode and the second portion of the second electrode are disposed with a separation groove interposed therebetween, (2) a state where the single first portion of the second electrode and the two second portions of the second electrode are provided, one end of the first portion is opposite to one of the second portions with one separation groove interposed therebetween, and the other end of the first portion is opposite to the other of the second portions with the other separation groove interposed therebetween, and (3) a state where two first portions of the second electrode and a single second portion of the second electrode are provided, an end portion of the second portion is opposite to one of the first portions with one separation groove interposed therebetween, and the other end of the second portion is opposite to the other of the first portions with the other separation groove interposed therebetween (that is, the second electrode has a structure where the first portion is interposed between the second portions).

In addition, in a broad sense, they may include (4) a state where N first portions of the second electrode and (N−1) second portions of the second electrode are provided, and the first portions of the second electrode are disposed with the second portions of the second electrode interposed therebetween, and (5) a state where N second portions of the second electrode and (N−1) first portions of the second electrode are provided, and the second portions of the second electrode are disposed with the first portions of the second electrode interposed therebetween.

In addition, the states in (4) and (5) are, in other words, (4') a state where N emission regions [carrier injection regions, or gain regions] and (N−1) saturable absorption regions [carrier non-injection regions] are provided, and the emission regions are disposed with the saturable absorption regions interposed therebetween, and (5') a state where N saturable absorption regions [carrier non-injection regions] and (N−1) emission regions [carrier injection regions, or gain regions] are provided, and the saturable absorption regions are disposed with the emission regions interposed therebetween.

In addition, by employing the structures of (3), (5) and (5'), it is difficult for damage to occur in the light emission end surface of the mode-locked semiconductor laser device.

The mode-locked semiconductor laser device may be manufactured, for example, using the following method. That is to say, it may be manufactured based on the manufacturing method including the respective steps:

(A) forming a laminate structure formed by sequentially laminating a first compound semiconductor layer made of a GaN based compound semiconductor and having a first conductivity type; a third compound semiconductor layer forming an emission region and a saturable absorption region made of the GaN based compound semiconductor; and a second compound semiconductor layer made of the GaN based compound semiconductor and having a second conductivity type different from the first conductivity type on a base, (B) forming a second electrode that has a strip shape and is formed on the second compound semiconductor layer, (C) forming a ridge stripe structure by etching a part of at least the second compound semiconductor layer using the second electrode as an etching mask, and (D) forming a resist layer which is used to form a separation groove in the second electrode, and then forming the separation groove in the second electrode using the resist layer as a wet etching mask so as to separate the second electrode into a first portion and a second portion by the separation groove.

In addition, by employing the manufacturing method, that is, since a part of the second compound semiconductor layer is etched using the strip-shaped second electrode as an etching mask so as to form the ridge stripe structure, that is, the ridge stripe structure is formed in a self-alignment manner using the patterned second electrode as an etching mask, there is no misalignment between the second electrode and the ridge stripe structure. In addition, the separation groove is formed in the second electrode using the wet etching method. As such, by employing the wet etching method, it is possible to suppress occurrence of deterioration in optical and electrical characteristics in the second compound semiconductor layer unlike in a dry etching method. Therefore, it is possible to reliably prevent occurrence of deterioration in emission characteristics.

In addition, in step (C), the second compound semiconductor layer may be partially etched in the thickness direction, the second compound semiconductor layer may be entirely etched in the thickness direction, the second compound semiconductor layer and the third compound semiconductor layer may be etched in the thickness direction, or, the second compound semiconductor layer, the third compound semiconductor layer, and a part of the first compound semiconductor layer may be etched in the thickness direction.

Further, in the above step (D), if an etching rate of the second electrode when the separation groove is formed in the second electrode is $ER_0$ and an etching rate of the laminate structure is $ER_1$, $ER_0/ER_1 \geq 1 \times 10$, and, preferably, $ER_0/ER_1 \geq 1 \times 10^2$ is satisfied. If $ER_0/ER_1$ satisfies such a relationship, it is possible to reliably etch the second electrode without etching the laminate structure (or slightly etched).

In the mode-locked semiconductor laser device, the laminate structure may be constituted by, specifically, AlGaInN based compound semiconductors. Here, AlGaInN based compound semiconductors may include, specifically, GaN, AlGaN, GaInN, and AlGaInN. Further, boron (B) atoms, thallium (Tl) atoms, arsenic (As) atoms, phosphorus (P) atoms, or antimony (Sb) atoms may be included in the compound semiconductors as desired. In addition, the third compound semiconductor layer (active layer) constituting the emission region (gain region) and the saturable absorption region preferably has a quantum well structure. Specifically, it may have a single quantum well structure [QW structure] or may have a multi-quantum well structure [MQW structure]. The third compound semiconductor layer (active layer) having the quantum well structure has a structure where a well layer and a barrier layer are laminated as at least one layer, and combinations of (compound semiconductors forming the well layer and the compound semiconductors forming the barrier layer) may include, for example, $(In_yGa_{(1-y)}N, GaN)$, $(In_yGa_{(1-y)}N, In_zGa_{(1-z)}N)$ [where y>z], and $(In_yGa_{(1-y)}N, AlGaN)$.

In addition, in the mode-locked semiconductor laser device, the second compound semiconductor layer may have a superlattice structure where a p-type GaN layer and a p-type AlGaN layer are alternately laminated, and a thickness of the superlattice structure may be 0.7 µm or less. By employing such a superlattice structure, a refractive index which is necessary as a clad layer is maintained and a series resistance component of the mode-locked semiconductor laser device is reduced, which thus lead to achieving a low operation voltage of the mode-locked semiconductor laser device. In addition, a lower limit value of the thickness of the superlattice structure which does not intend limitation may be, for example, 0.3 µm, a thickness of the p-type GaN layer forming the superlattice structure may be, for example, 1 nm to 5 nm, a thickness of the p-type AlGaN layer forming the superlattice structure may be, for example, 1 nm to 5 nm, and a total number of layers of the p-type GaN layer and the p-type AlGaN layer may be, for example, 60 to 300. In addition, a distance from the third compound semiconductor layer to the second electrode is 1 µm or less, and, preferably, 0.6 µm or less. As such, by regulating the distance from the third compound semiconductor layer to the second electrode, the thickness of the p-type second compound semiconductor layer having high resistance can be made to be small, and thus it is possible to reduce an operation voltage of the mode-locked semiconductor laser device. In addition, a lower limit value of the distance from the third compound semiconductor layer to the second electrode, which does not intend limitation, may be, for example, 0.3 µm. In addition, the second compound semiconductor layer is doped with Mg of $1 \times 10^{19}$ cm$^{-3}$ or more, and an absorption coefficient of the second compound semiconductor layer to light of the wavelength 405 nm from the third compound semiconductor layer may be at least 50 cm$^{-1}$. Such atomic concentration of Mg is derived from the material property showing the maximum hole concentration at a value of $2 \times 10^{19}$ cm$^{-3}$, and is a result designed so as to represent the maximum hole concentration, that is, to minimize resistivity of the second compound semiconductor layer. The absorption coefficient of the second compound semiconductor layer is regulated from the viewpoint of reducing resistance of the mode-locked semiconductor laser device as much as possible, and, as a result, the absorption coefficient of light of the third compound semiconductor layer is generally 50 cm$^{-1}$. However, in order to increase the absorption coefficient, an Mg doping amount can be intentionally set to concentration of $2 \times 10^{19}$ cm$^3$ or more. In this case, the upper limit of the Mg doping amount for obtaining practical hole concentration is, for example, $8 \times 10^{19}$ cm$^{-3}$. In addition, the second compound semiconductor layer includes a non-doped compound semiconductor layer and a p-type compound semiconductor layer from the third compound semiconductor layer side, and a distance from the third compound semiconductor layer to the p-type compound semiconductor layer may be $1.2 \times 10^{-7}$ m or less. By regulating the distance from the third compound semiconductor layer to the p-type compound semiconductor layer as such, an internal loss can be suppressed within a range where internal quantum efficiency is not reduced, and thereby it is possible to reduce a threshold value current density where laser oscillation starts. In addition, a lower limit value of the distance from the third compound semiconductor layer to the p-type compound semiconductor layer, which does not intend limitation, may be, for example, $5 \times 10^{-8}$ m. A laminate insulating film constituted by a SiO$_2$/Si laminate structure is formed at both sides of the ridge stripe structure, and a difference between an effective refractive index of the ridge stripe structure and an effective refractive index of the laminate insulating film may be $5 \times 10^{-3}$ to $1 \times 10^{-2}$. By the use of the laminate insulating film, it is possible to maintain a single basic transverse mode even at a high output operation exceeding 100 milliwatts. In addition, the second compound semiconductor layer may have a structure formed by laminating, for example, a non-doped GaInN layer (a p side light guide layer), an Mg doped AlGaN layer (electron barrier layer), a superlattice structure (superlattice clad layer) of GaN layer (Mg doped)/AlGaN layer, and an Mg doped GaN layer (p side contact layer), from the third compound semiconductor layer side. A band gap of the compound semiconductor forming the well layer in the third compound semiconductor layer is preferably 2.4 eV or more. In addition, a wavelength of laser light emitted from the third compound semiconductor layer (active layer) is 360 nm to 500 nm, and, preferably, 400 nm to 410 nm. Here, needless to say, the above-described various configurations may be appropriately combined with each other.

Although, in the mode-locked semiconductor laser device, a variety of GaN based compound semiconductor layers constituting the mode-locked semiconductor laser device are sequentially formed, here, as a substrate, in addition to the sapphire substrate, a GaAs substrate, a GaN substrate, an SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, or a substrate where a ground layer or a buffer layer is formed on a surface (main surface) of such substrate, may be used. In a case where a GaN based compound semiconductor layer is mainly formed on a substrate, the GaN substrate is preferred on account of a low defect density, but it is known that the GaN substrate changes between polar/non-polar/semipolar characteristics depending on a growth surface. In addition, methods of forming the various compound semiconductor layers (for example, GaN based compound semiconductor layers) constituting the mode-locked semiconductor laser device may include a metal organic chemical vapor deposition method (an MOCVD method, an MOVPE method), a molecular beam epitaxy method (an MBE method), a hydride vapor phase epitaxy method where halogen contributes to transport or reaction, and the like.

Here, as an organic gallium source gas in the MOCVD method, a trimethylgallium (TMG) gas or a triethylgallium (TEG) gas may be used, and, as a nitrogen source gas, an ammonia gas or a hydrazine gas may be used. In addition, in forming a GaN based compound semiconductor layer having an n-type conductivity type, for example, silicon (Si) may be added as an n-type impurity (an n-type dopant), and, in forming a GaN based compound semiconductor layer having a p-type conductivity type, for example, magnesium (Mg) may be added as a p-type impurity (a p-type dopant). Further, in a case where aluminum (Al) or indium (In) is included as a constituent atom of the GaN based compound semiconductor layer, a trimethylaluminum (TMA) gas may be used as an Al source, and, a trimethylindium (TMI) gas may be used as an In source. Furthermore, as a Si source, a monosilane gas (SiH$_4$ gas) may be used, and, as a Mg source, a (cyclopentadienyl)magnesium gas, a methyl(cyclopentadienyl)magnesium gas, or a bis(cyclopentadienyl) magnesium (Cp$_2$Mg) gas may be used. In addition, in addition to Si, as an n-type impurity (an n-type dopant), Ge, Se, Sn, C, Te, S, O, Pd, or Po may be used, and, in addition to Mg, as a p-type impurity (a p-type dopant), Zn, Cd, Be, Ca, Ba, C, Hg, or Sr may be used.

When the first conductivity type is an n type, the first electrode which is electrically connected to the first compound semiconductor layer having an n-type conductivity type preferably has a single layer configuration or a multi-layer configuration which includes at least one kind of metal selected from a group including gold (Au), silver (Ag), palladium (Pd), Al (aluminum), Ti (titanium), tungsten (W), Cu (copper), Zn (zinc), tin (Sn), and indium (In), and may include, for example, Ti/Au, Ti/Al, and Ti/Pt/Au. Although the first electrode is electrically connected to the first compound semiconductor layer, a form where the first electrode is formed on the first compound semiconductor layer and a form where the first electrode is connected to the first compound semiconductor layer via a conductive material layer or a conductive substrate are included. The first electrode or the second electrode may be formed using, for example, a PVD method such as a vacuum deposition method or a sputtering method.

A pad electrode may be provided on the first electrode or the second electrode in order to be electrically connected to external electrodes or circuits. The pad electrode preferably has a single layer configuration or a multilayer configuration including at least one kind of metal selected from a group including Ti (titanium), Al (aluminum), Pt (platinum), gold (Au), and Ni (nickel). Alternatively, the pad electrode may have a multilayer configuration exemplified as a multilayer configuration of Ti/Pt/Au or a multilayer configuration of Ti/Au.

In the mode-locked semiconductor laser device with the first configuration or the second configuration, as described above, a configuration is preferable in which a reverse bias voltage is preferably applied between the first electrode and the second portion (that is, a configuration in which the first electrode is in a positive polarity and the second portion is in a negative polarity). In addition, a pulse current or a pulse voltage synchronized with a pulse current or a pulse voltage applied to the first portion of the second electrode may be applied to the second portion of the second electrode, or a DC bias may be applied thereto. Further, there may be a form in which a current is made to flow from the second electrode to the first electrode via the emission region and an external electric signal is superimposed to the first electrode from the second electrode via the emission region. Thereby, a laser light pulse and the external electric signal can be synchronized with each other. Alternatively, there may be a form in which a light signal is incident from one end surface of the laminate structure. Thereby, a laser light pulse and the light signal can be synchronized with each other as well. In addition, in the second compound semiconductor layer, a non-doped compound semiconductor layer (for example, a non-doped GaInN layer, or a non-doped AlGaN layer) may be formed between the third compound semiconductor layer and the electron barrier layer. Further, a non-doped GaInN layer may be formed as a light guide layer between the third compound semiconductor layer and the non-doped compound semiconductor layer. There may be a structure in which an Mg doped GaN layer (a p side contact layer) takes up the uppermost layer of the second compound semiconductor layer.

The mode-locked semiconductor laser device is not limited to a bi-section type (two-electrode type) semiconductor laser device, and may employ a multi-section type (multi-electrode type) semiconductor laser device, or a semiconductor laser device of an SAL (Saturable Absorber Layer) type where an emission region and a saturable absorption region are disposed in a vertical direction or a WI (Weakly Index guide) type where a saturable absorption region is provided along the ridge stripe structure.

The semiconductor laser apparatus assembly of the present disclosure may be applied to fields such as, for example, an optical disc system, a communication field, an optical information field, a photoelectron integrated circuit, a field practically using nonlinear optical phenomena, optical switches, a laser measurement field, various analysis fields, an ultra high speed spectroscopy field, a multi-photon excitation spectral field, a mass spectrometry field, a microspectroscopy field using multi-photon absorption, quantum control of chemical reaction, a three-dimensional nano processing field, various processing fields practically using multi-photon absorption, a medical field, and a bio imaging field.

Embodiment 1

Figure 2:
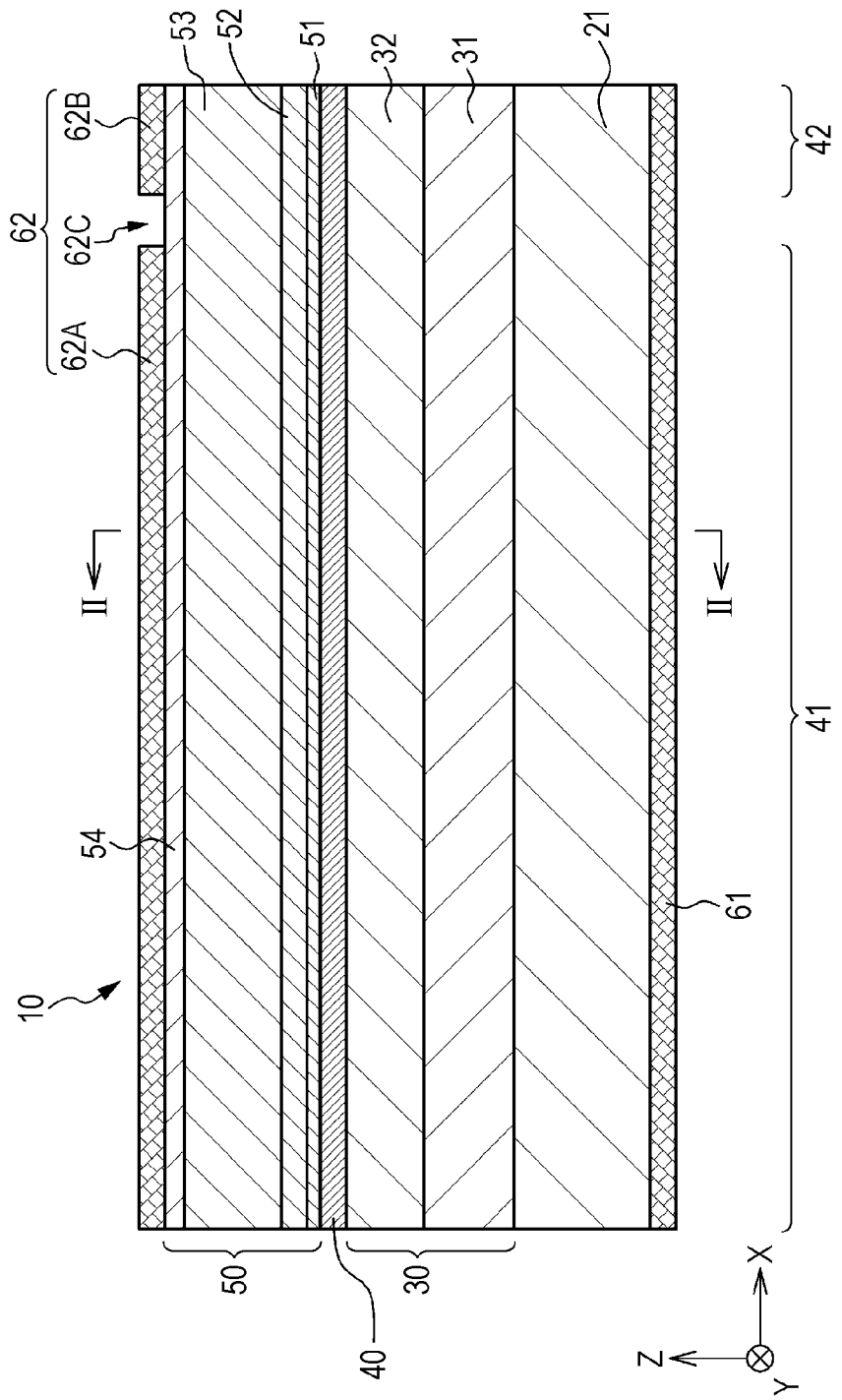
FIG. 2 is a schematic cross-sectional view in a direction in which a resonator of the mode-locked semiconductor laser device according to Embodiment 1 extends.
Figure 3:
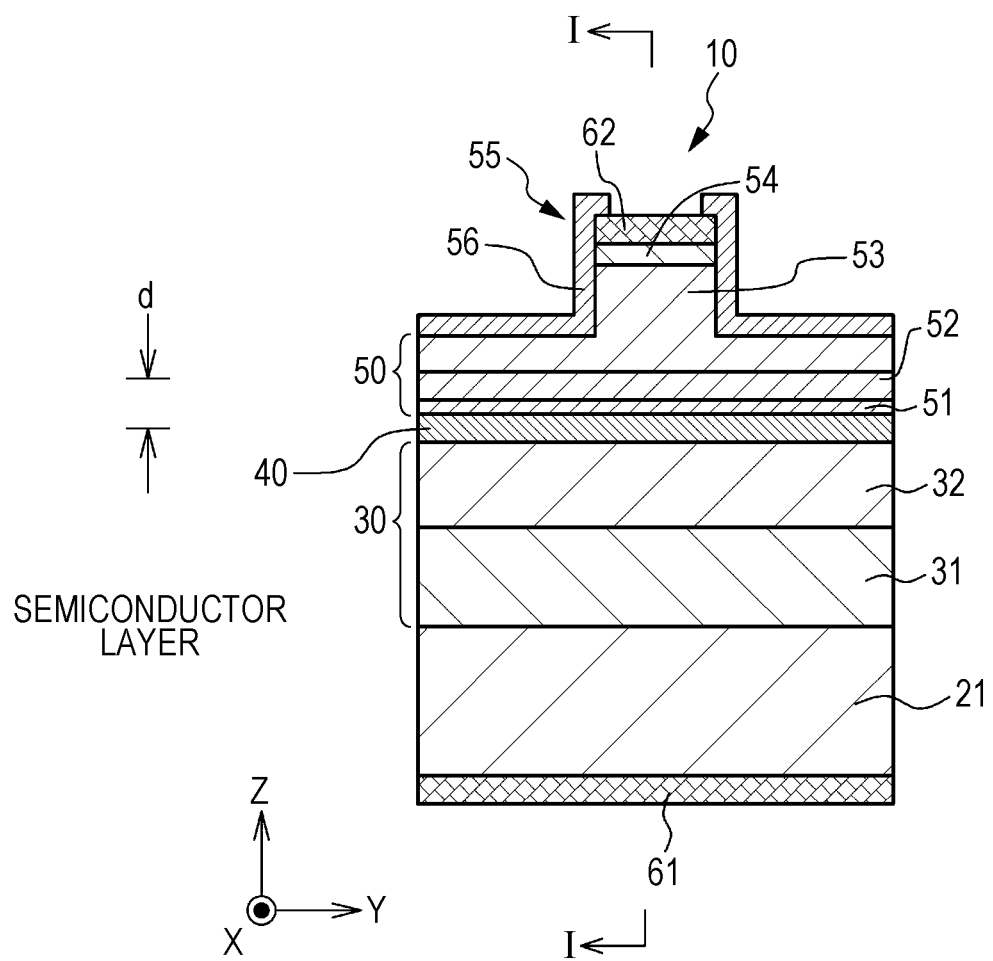
FIG. 3 is a schematic cross-sectional view in a direction perpendicular to the direction where the resonator of the mode-locked semiconductor laser device according to Embodiment 1 extends.

Embodiment 1 relates to a semiconductor laser apparatus assembly related to the first aspect and the second aspect of the present disclosure. FIG. 1 is a conceptual diagram of the semiconductor laser apparatus assembly according to Embodiment 1; FIG. 2 is a schematic cross-sectional view in a direction where a resonator of the mode-locked semiconductor laser device 10 extends; and FIG. 3 is a schematic cross-sectional view in a direction perpendicular to the direction where the resonator of the mode-locked semiconductor laser device extends.

When a description is made according to the semiconductor laser apparatus assembly related to the first aspect of the present disclosure, the semiconductor laser apparatus assembly according to Embodiment 1 includes a mode-locked semiconductor laser device 10 of passive mode locking of which a light density is $1 \times 10^{10}$ watts/cm$^2$ or more and which is of a current injection type where a carrier density is $1 \times 10^{19}$/cm$^3$ or more, and a dispersion compensation optical system 110 to and from which laser light emitted from the mode-locked semiconductor laser device 10 is incident and emitted.

In addition, when a description is made according to the semiconductor laser apparatus assembly related to the second aspect of the present disclosure, the semiconductor laser apparatus assembly includes a mode-locked semiconductor laser device 10 of passive mode locking which is of a current injection type, and a dispersion compensation optical system 110 to and from which laser light emitted from the mode-locked semiconductor laser device 10 is incident and emitted, wherein, when a group velocity dispersion of the dispersion compensation optical system 110 monotonously varies from a first predetermined value $GVD_1$ to a second predetermined value $GVD_2$ (where $|GVD_1|<|GVD_2|$), a pulse time width of laser light output to the outside of the system from the mode-locked semiconductor laser device 10 is reduced and is then increased exceeding the minimum value $PW_{min}$.

Here, in Embodiment 1 or Embodiment 2 to Embodiment 4 described later, the mode-locked semiconductor laser device 10 has a laminate structure formed by sequentially laminating a first compound semiconductor layer 30 made of a GaN based compound semiconductor and having a first conductivity type; a third compound semiconductor layer (active layer) 40 made of the GaN based compound semiconductor; and a second compound semiconductor layer 50 made of the GaN based compound semiconductor and having a second conductivity type different from the first conductivity type.

In addition, the group velocity dispersion in the dispersion compensation optical system 110 is a negative value. In other words, $0>GVD_1>GVD_2$, and thus the group velocity dispersion of the dispersion compensation optical system 110 is monotonously decreased from the first predetermined value $GVD_1$ to the second predetermined value $GVD_2$.

In Embodiment 1, laser light emitted from the mode-locked semiconductor laser device 10 is incident to the dispersion compensation optical system 110, a portion of the laser light incident to the dispersion compensation optical system 110 is emitted from the dispersion compensation optical system 110 and returns to the mode-locked semiconductor laser device 10, and the remainder of the laser light incident to the dispersion compensation optical system 110 is output to the outside of the system. An external resonator structure includes the dispersion compensation optical system 110. In addition, specifically, the dispersion compensation optical system 110 is constituted by a holographic type diffraction grating 111, condensing means (specifically, a lens) 112, and a reflection mirror (a plane reflection mirror, specifically, for example, a dielectric multilayer film reflection mirror) 113. Further, the external resonator is constituted by the reflection mirror 113 and the first end surface of the mode-locked semiconductor laser device 10. The diffraction grating 111 causes first order or more diffracted light of pulse-shaped laser light emitted from the mode-locked semiconductor laser device 10 to be collected at the condensing means 112 such that 0-th order diffracted light (reflected light) is output to the outside of the system. An aspherical convex lens which has a focal length 4.0 mm and is collimating means 11 for generating parallel light fluxes of laser light from the mode-locked semiconductor laser device 10 is disposed between the mode-locked semiconductor laser device 10 and the diffraction grating 111. The number of patterns of a grid in the diffraction grating included in the laser light which is incident to (impacted on) the diffraction grating is 2400/mm in Embodiment 1. In addition, the pulse-shaped laser light emitted from the mode-locked semiconductor laser device 10 is impacted on the diffraction grating 111, and first order or more diffracted light is incident to the condensing means (lens) 112, is reflected by the reflection mirror 113, and returns to the mode-locked semiconductor laser device 10 via the condensing means 112 and the diffraction grating 111. In addition, 0-th order diffracted light (reflected light) is output to the outside of the system.

If a distance between the diffraction grating 111 and the condensing means 112 and the reflection mirror 113 is changed in a state of fixing a distance between the condensing means 112 and the reflection mirror 113 using well-known moving means, a group velocity dispersion (dispersion compensation amount) in the dispersion compensation optical system 110 can be changed. Specifically, the condensing means 112 and the reflection mirror 113 are integrally moved on the light axis (on the light path of the first order diffracted light) of the condensing means 112, and thereby laser light incident to and laser light emitted from the dispersion compensation optical system 110 mutually cause variations in dispersion. In Embodiment 1, the distance between the condensing means 112 and the reflection mirror 113 is 100 mm, and the focal length of the condensing means (lens) 112 having a positive power is 100 mm. In other words, the distance between the condensing means 112 and the reflection mirror 113 corresponds with the focal length of the condensing means (lens) 112 having a positive power, and an image of the laser light is formed on the reflection mirror 113 by the condensing means 112. The light incident to the condensing means 112 and the light emitted therefrom have a relationship between incident light and emitted light in a telescope with the magnification of 1.0.

For example, in a case where the distance between the diffraction grating 111 and the condensing means 112 is the same as the focal length of the condensing means 112, there is no variation in angle dispersion of laser light traveling toward the condensing means 112 from the diffraction grating 111 and laser light which is reflected by the reflection mirror 113 and is incident to the diffraction grating 111 via the condensing means 112. Therefore, in this case, a dispersion compensation amount given by the dispersion compensation optical system is zero. On the other hand, in a case where the distance between the diffraction grating 111 and the condensing means 112 is longer than the focal length of the condensing means 112, a light path of the long wavelength component of laser light diffracted by the diffraction grating 111 is longer than a light path of the short wavelength component, and, in this case, negative group velocity dispersion is formed. That is to say, a group velocity dispersion is a negative value. In the following description, the distance between the diffraction grating 111 and the condensing means 112 is referred to as a "distance L". The distance L=0 mm means that the distance between the diffraction grating 111 and the condensing means 112 is the same as the focal length of the condensing means 112, and a value of the distance L (L>0) means that the distance between the diffraction grating 111 and the condensing means 112 is longer than the focal length of the condensing means 112 by Lmm. The dispersion compensation amount is an amount proportional to the distance L described later. Dispersion given by the dispersion compensation optical system 110 when the distance L is a positive value is negative group velocity dispersion.

Figure 21:
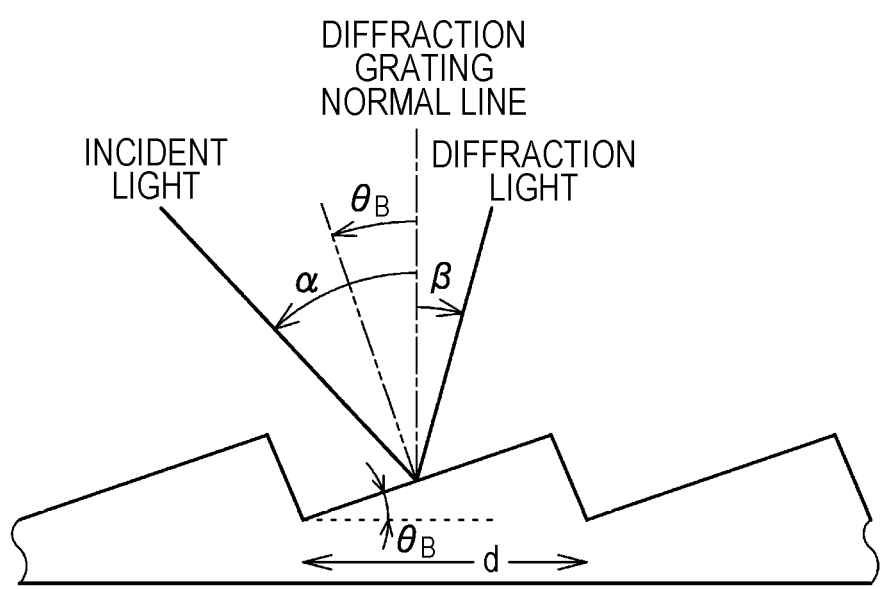
FIG. 21 is a schematic partial cross-sectional view of a diffraction grating.

As shown in FIG. 21, it is assumed that light of a wavelength $\lambda$ is incident to a reflective type diffraction grating with an angle $\alpha$ and is diffracted with an angle $\beta$. Here, the angles $\alpha$ and $\beta$ are angles from the normal line of the diffraction grating, and values in the counter-clockwise rotation are positive values. Then, the grating equation is as follows. Here, $d_G$ is an interval of grooves of the diffraction grating, and m is a diffraction order (where m=0, ±1, ±2, . . . ).

$$d_G \times \{\sin(\alpha)+\sin(\beta)\}=m\cdot\lambda \quad (A)$$

When the incident light and the m-th order diffracted light have a relationship of specular reflection with respect to the tilt surface of the groove, most of energy is concentrated on the m-th order diffracted light. A tilt of the groove at this time is referred to as a blaze angle which is denoted by $\theta_B$ and is as follows.

$$\theta_B=(\alpha+\beta)/2$$

In addition, a wavelength at this time is a blaze wavelength which is denoted by $\lambda_B$ and is as follows.

$$\lambda_B=\{2d_G/m\}\sin(\theta_B)\cdot\cos(\alpha-\theta_B)$$

In the semiconductor laser apparatus assembly according to Embodiment 1, wavelength selecting means 200 is further provided. In addition, the wavelength selecting means 200 extracts a short wavelength component of laser light output to the outside of the system. Specifically, the wavelength selecting means 200 is constituted by a bandpass filter. Thereby, incoherent light pulse components are removed and coherent light pulses can be obtained. The bandpass filter can be obtained by laminating, for example, a dielectric thin film having a low dielectric constant and a dielectric thin film having a high dielectric constant. In addition, the reference numeral 201 denotes a plane mirror.

In Embodiment 1 or Embodiment 2 to Embodiment 4 described later, the mode-locked semiconductor laser device 10 includes a saturable absorption region. Specifically, the mode-locked semiconductor laser device 10 is constituted by the bi-section type mode-locked semiconductor laser device 10 where the emission region and the saturable absorption region are disposed in parallel in a direction of the resonator. Specifically, the bi-section type mode-locked semiconductor laser device 10 around the emission wavelength 405 nm includes, as shown in FIGS. 2 and 3, (a) a laminate structure formed by sequentially laminating a first compound semiconductor layer 30 having a first conductivity type (in the respective embodiments, specifically, an n-type conductivity type) and made of a GaN based compound semiconductor; a third compound semiconductor layer (active layer) 40 made of the GaN based compound semiconductor and constituting an emission region (gain region) 41 and a saturable absorption region 42; and a second compound semiconductor layer 50 having a second conductivity type (in the respective embodiments, specifically, a p-type conductivity type) different from the first conductivity type and made of the GaN based compound semiconductor, (b) a second electrode 62 formed on the second compound semiconductor layer 50 and having a strip shape, and (c) a first electrode 61 electrically connected to the first compound semiconductor layer 30.

The mode-locked semiconductor laser device 10 in Embodiment 1 or Embodiment 2 to Embodiment 4 described later is, specifically, a semiconductor laser device having a ridge stripe type separate confinement heterostructure (SCH structure). More specifically, the mode-locked semiconductor laser device 10 is a GaN based semiconductor laser device made of index guide type AlGaInN and has a ridge stripe structure. In addition, the first compound semiconductor layer 30, the third compound semiconductor layer 40, and the second compound semiconductor layer 50 are constituted by, specifically, an AlGaInN based compound semiconductor, and, more specifically, has a layer configuration shown in the following Table 1. Here, in Table 1, compound semiconductor layers disclosed on the lower side are layers close to an n-type GaN substrate 21. A band gap of the compound semiconductor forming the well layer in the third compound semiconductor layer 40 is 3.06 eV. The mode-locked semiconductor laser device 10 in the Embodiment 1 or Embodiment 2 to Embodiment 4 described later is provided on the (0001) plane of the n-type GaN substrate 21, and the third compound semiconductor layer 40 has a quantum well structure. The (0001) plane of the n-type GaN substrate 21 is also referred to as a "C plane" and is a polar crystal plane.

[Table 1]
Second Compound Semiconductor Layer 50
   p-type GaN contact layer (Mg doped) 54
   p-type GaN (Mg doped)/AlGaN superlattice clad layer 53
   p-type AlGaN electron barrier layer (Mg doped) 52
   Non-doped GaInN light guide layer 51
Third Compound Semiconductor Layer 40
   GaInN quantum well active layer
   (Well layer: $Ga_{0.92}In_{0.08}N$/Barrier layer: $Ga_{0.98}In_{0.02}N$)
First Compound Semiconductor Layer 30
   n-type GaN clad layer 32
   n-type AlGaN clad layer 31
where
Well layer (two layers) 8 nm non-doped
Barrier layer (three layers) 14 nm Si doped In addition, parts of the p-type GaN contact layer 54 and the p-type GaN/AlGaN superlattice clad layer 53 are removed using an RIE method so as to form a ridge stripe structure 55. A laminate insulating film 56 made of $SiO_2$/Si is formed at both sides of the ridge stripe structure 55. In addition, the $SiO_2$ layer is a lower layer and the Si layer is an upper layer. Here, a difference between the effective refractive index of the ridge stripe structure 55 and the effective refractive index of the laminate insulating film 56 is $5\times10^{-3}$ to $1\times10^{-2}$, specifically, $7\times10^{-3}$. In addition, a second electrode (a p side ohmic electrode) 62 is formed on the p-type GaN contact layer 54 corresponding to the top face of the ridge stripe structure 55. On the other hand, a first electrode (an n side ohmic electrode) 61 made of Ti/Pt/Au is formed on the rear surface of the n-type GaN substrate 21.

In the mode-locked semiconductor laser device 10 in Embodiment 1 or Embodiment 2 to Embodiment 4 described later, the internal loss is suppressed in a range where internal quantum efficiency is not reduced such that the p-type AlGaN electron barrier layer 52, the p-type GaN/AlGaN superlattice clad layer 53, and the p-type GaN contact layer 54, which are Mg doped compound semiconductor layers, do not overlap the third compound semiconductor layer 40 and a light density distribution generated from the vicinity thereof. Thereby, a threshold value current density where laser oscillation starts is reduced. Specifically, the distance d from the third compound semiconductor layer 40 to the p-type AlGaN electron barrier layer 52 is 0.10 μm, the height of the ridge stripe structure 55 is 0.30 μm, the thickness of the second compound semiconductor layer 50 located between the second electrode 62 and the third compound semiconductor layer 40 is 0.50 μm, and the thickness of the portion of the p-type GaN/AlGaN superlattice clad layer 53 located under the second electrode 62 is 0.40 μm. Further, the ridge stripe structure 55 is curved toward the second end surface in order to reduce end surface reflection, but is not limited to this shape.

In addition, in the mode-locked semiconductor laser device 10 in Embodiment 1 or Embodiment 2 to Embodiment 4 described later, the second electrode 62 is separated into a first portion 62A which causes a DC current to flow to the first electrode 61 via the emission region (gain region) 41 so as to enter a forward bias state, and a second portion 62B (a second portion 62B for applying a reverse bias voltage $V_{sa}$ to the saturable absorption region 42) for applying an electric field to the saturable absorption region 42, by a separation groove 62C. Here, electrical resistivity (referred to as "separation resistivity" in some cases) between the first portion 62A and the second portion 62B of the second electrode 62 is $1\times10$ or more times the electrical resistivity between the second electrode 62 and the first electrode 61, and, specifically $1.5\times10^3$ times. In addition, the electrical resistivity (separation resistivity) between the first portion 62A and the second portion 62B of the second electrode 62 is $1\times10^2 \Omega$ or more, and, specifically, $1.5\times10^4 \Omega$. The resonator length of the mode-locked semiconductor laser device 10 is 600 μm, and the lengths of the first portion 62A and the second portion 62B of the second electrode 62 and the separation groove 62C are respectively 560 μm, 30 μm, and 10 μm. In addition, the width of the ridge stripe structure 55 is 1.4 μm.

In the mode-locked semiconductor laser device 10 in the Embodiment 1 or Embodiment 2 to Embodiment 4 described later, a non-reflection coat layer (AR) is formed on a light emission end surface (second end surface) opposite to the collimating means 11. On the other hand, a high reflection coat layer (HR) is formed on an end surface (first end surface) opposite to the light emission end surface (second end surface) in the mode-locked semiconductor laser device 10. The saturable absorption region 42 is provided on the first end surface side in the mode-locked semiconductor laser device 10. Here, the non-reflection coat layer (the low reflection coat layer) may include a laminate structure of at least two kinds of layers selected from a group including, for example, a titanium oxide layer, a tantalum oxide layer, a zirconium oxide layer, a silicon oxide layer, and an aluminum oxide layer.

A pulse repetition frequency of the mode-locked semiconductor laser device 10 in the Embodiment 1 or Embodiment 2 to Embodiment 4 described later is 1 GHz. In addition, the repetition frequency f of a light pulse train is determined by the external resonator length X' (a distance between the first end surface and the reflection mirror 113) and is expressed by the following equation. Here, c is the velocity of light, and n is the effective refractive index of the resonator.

$$f=c/(2n\cdot X')$$

However, in order to obtain an optical gain which is required for laser oscillation, it is necessary to form inverted population by injecting (exciting) high density carriers into the active layer 40. Here, when the semiconductor laser device is made of GaN based compound semiconductors having great electron and hole effective mass, if an optical gain is to have a positive value, it is necessary to exceed a carrier density of the active layer 40 to exceed $10^{19}/cm^3$. (For example, refer to, supervised by Kiyoshi Takahashi, edited and written by Akihiko Yoshikawa and Fumio Hasegawa, "Wide Bandgap Semiconductor Photonic and Electronic Devices", Morikita Publishing Co, Ltd., p. 124 to 126). This inverted population carrier density is higher than in the semiconductor laser device made of GaAs based compound semiconductors disclosed in, for example, the above-described NPL 1 by about one digit, and it is necessary to inject carriers of a very high density in order to oscillate the semiconductor laser device made of the GaN based compound semiconductors. In the mode-locked semiconductor laser device in Embodiment 1, a carrier density (inverted population carrier density) is estimated as about $1.7 \times 10^{19}/cm^3$.

Hereinafter, a description will be made of a state of generated light pulses of subpicoseconds.

A measurement principle of intensity correlation measurement of light pulses, the kind of correlation function, a pulse time width, and a deriving method are described in detail, in Yariv, "Introduction to Optical Electronics 3rd Ed." MARUZEN Co., Ltd., pages 183 to 196, or Vasil'ev, "Ultrafast diode lasers", Artech House, pp 39 to 43.

Figure 4A:
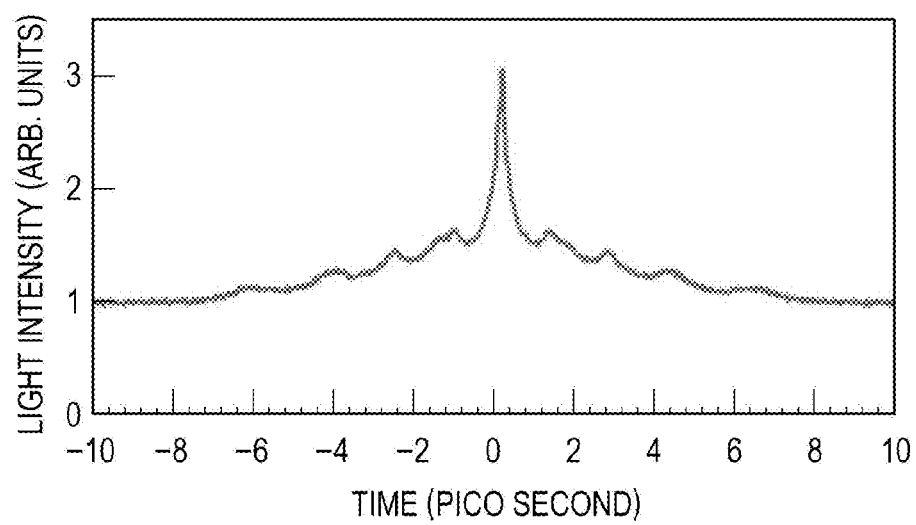
FIGS. 4A and 4B are respectively a diagram illustrating a correlation waveform of light pulses obtained by the semiconductor laser apparatus assembly according to Embodiment 1 and a diagram illustrating an optical spectrum of the light pulses.

A correlation waveform of light pulses obtained in the semiconductor laser apparatus assembly according to Embodiment 1 is shown in FIG. 4A. In addition, the transverse axis of FIG. 4A expresses time (unit: picosecond) and the longitudinal axis expresses a light intensity (unit: arbitrary). Here, as driving conditions of the semiconductor laser apparatus assembly, a DC current (gain current I) which flows from the second electrode 62 to the first electrode 61 via the emission region (gain region) 41 is 130 milliampere, a reverse bias voltage $V_{sa}$ applied to the saturable absorption region 42 is −7 V, and L=7.28 mm. In addition, a group velocity dispersion in the dispersion compensation optical system 110 is −0.0390 ps² [(picosecond)²].

Figure 4B:
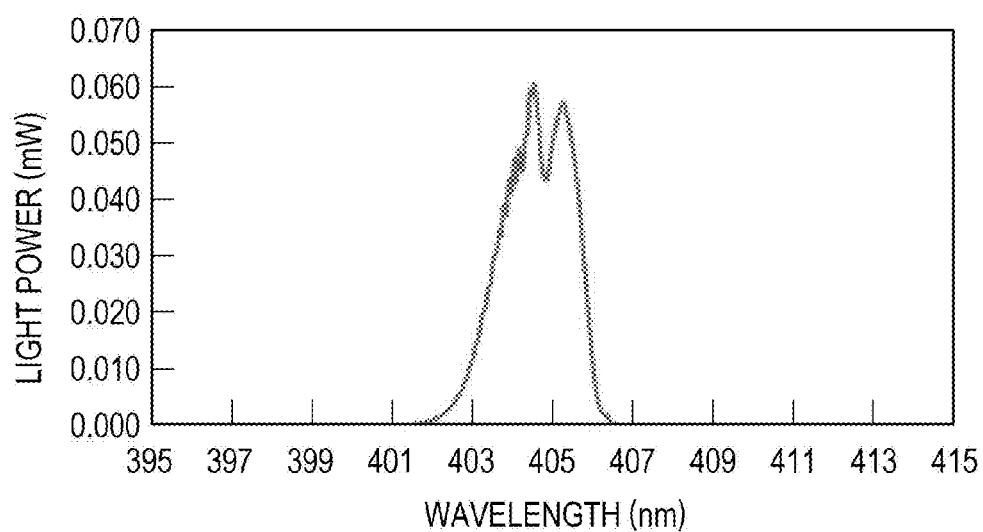
Figure 5A:
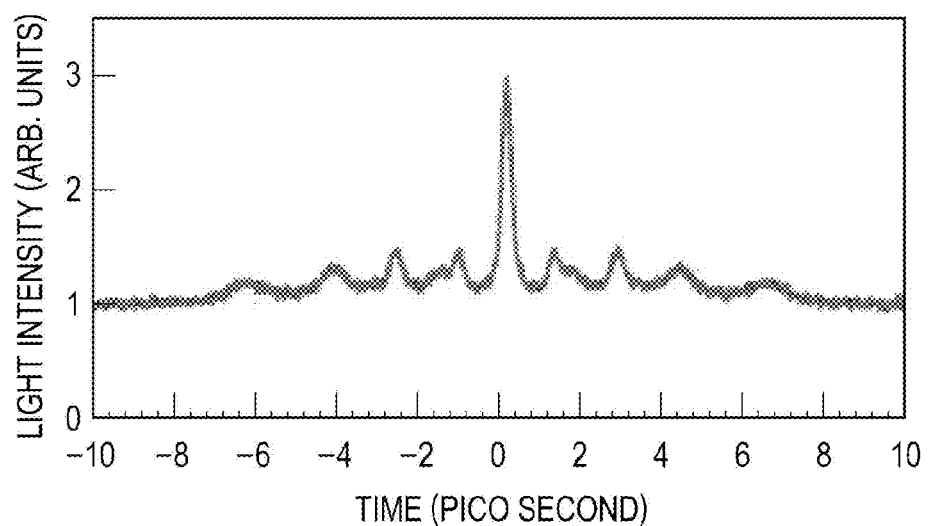
FIGS. 5A and 5B are respectively a diagram illustrating a correlation waveform when the light pulses shown in FIG. 4B are transmitted through wavelength selecting means and short wavelength sides of the light pulses are cut and a diagram illustrating an optical spectrum.
Figure 5B:
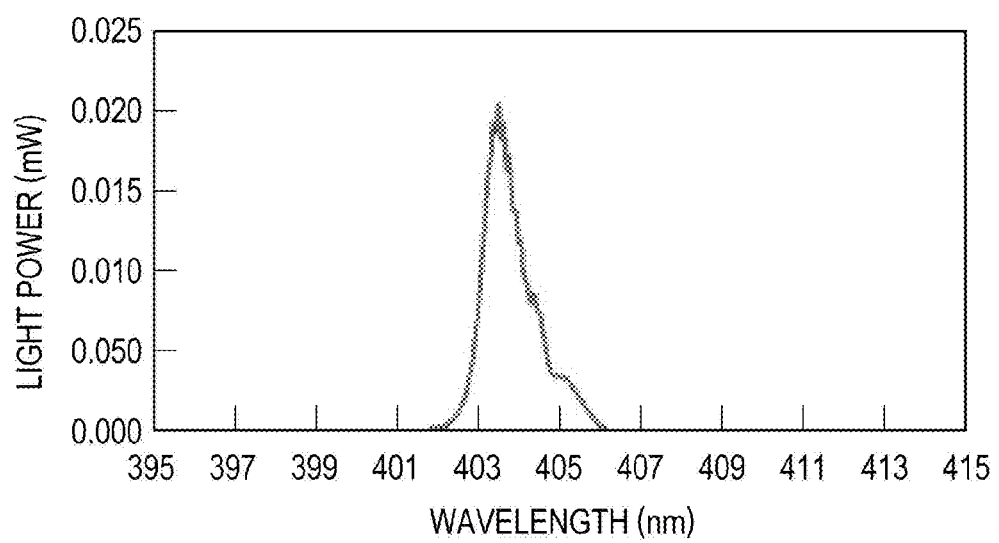

A value of the full width at half maximum (FWHM) of the obtained light pulses is 0.45 picoseconds, and shows characteristic forms different from those of a correlation waveform of Gauss type or sech² type light pulses. An optical spectrum at this time is shown in FIG. 4B. In addition, the transverse axis of FIG. 4B expresses a wavelength (unit: nm) and the longitudinal axis expresses a light power (unit: milliwatt). FIG. 5A shows a correlation waveform when the light pulses obtained in this way are transmitted through the wavelength selecting means 200 constituted by a bandpass filter (transmission band Δλ=1.3 nm), and a short wavelength side of the light pulses is cut. In addition, the transverse axis of FIG. 5A expresses time (unit: picosecond) and the longitudinal axis expresses a light intensity (unit: arbitrary). Through the transmission of the wavelength selecting means 200, tails (skirts) of the correlation waveform are removed and thus a sech² type correlation waveform (for convenience, referred to as a "correlation waveform of the central portion") can be obtained around the time zero, thereby obtaining a plurality of side pulses at both sides of the correlation waveform of the central portion. The full width at half maximum of the correlation waveform of the central portion is 290 femtoseconds, and a full width at half maximum of the generated light pulses is evaluated as 190 femtoseconds when a convolution factor 0.65 of the self-correlation function of the sech² type function is used. An optical spectrum at this time is shown in FIG. 5B, and a spectral width is 1.06 nm. The time-bandwidth product is calculated as 0.34 which is close to the limit 0.315 of the Fourier product of the sech² type function. In addition, the transverse axis of FIG. 5B expresses a wavelength (unit: nm) and the longitudinal axis expresses a light power (unit: milliwatt). Further, output power from the semiconductor laser apparatus assembly is 11.46 milliwatts before being transmitted through the wavelength selecting means 200 and is 3.0 milliwatts after being transmitted through the wavelength selecting means 200. The repetition frequency of the laser light is 1.03 GHz, and peak power is calculated as 10 watts from the obtained pulse time width. In addition, 66% of the pulse energy was assumed to be concentrated on a central pulse from the heights of a plurality of pulses shown in the correlation waveform.

Figure 6:
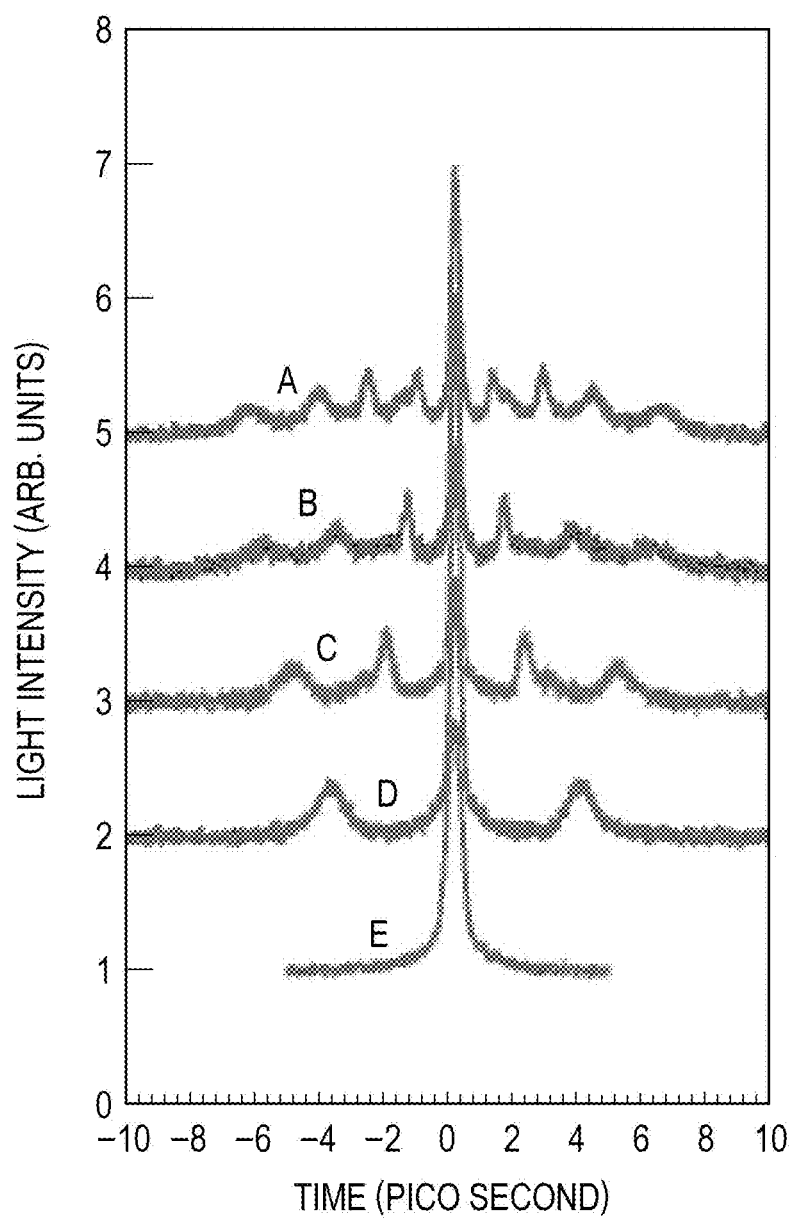
FIG. 6 is a diagram illustrating a correlation waveform of light pulses at various dispersion compensation amounts.

Such characteristic pulse shape varies depending on a dispersion compensation amount (group velocity dispersion). FIG. 6 shows correlation waveforms of light pulses at various dispersion compensation amounts. In addition, the transverse axis of FIG. 6 expresses time (unit: picosecond) and the longitudinal axis expresses a light intensity (unit: arbitrary). All the correlation waveforms are pulse waveforms after being transmitted through the wavelength selecting means 200. In addition, the gain current I is 120 milliamperes, and the reverse bias voltage $V_{sa}$ is −7 V. In FIG. 6, a group velocity dispersion at each light pulse is as follows. From FIG. 6, it can be seen that the group velocity dispersion is decreased (an absolute value of the group velocity dispersion is increased) and, at the same time, the number of sub-pulses other than the main pulse at the time zero is reduced. Further, a group velocity dispersion is decreased (an absolute value of the group velocity dispersion is increased), and, at the same time, a pulse time width of the main pulse is increased. In addition, a group velocity dispersion when the light pulses "A" are obtained is a minimum group velocity dispersion $GVD_{min}$, a group velocity dispersion when the light pulses "E" are obtained is an upper limit value $GVD_S$ of the group velocity dispersion, and the "vicinity of the group velocity dispersion" is defined by $GVD_S \pm |GVD_{min} - GVD_S|$.

Light pulses "A": −0.0390 ps²
Light pulses "B": −0.0406 ps²
Light pulses "C": −0.0443 ps²
Light pulses "D": −0.0497 ps²
Light pulses "E": −0.0630 ps²

From the above results, if the shortest pulse time width is to be obtained, it is necessary to decrease a negative group velocity dispersion (group velocity dispersion) in a certain range. However, in some cases, sub-pulses are generated, and thus it is not necessarily preferable that the pulse time width is merely made to be shortest according to usages of the semiconductor laser apparatus assembly. For example, in a case where generated ultrashort pulses are amplified by a semiconductor optical amplifier, there is concern that amplified pulse energy may be distributed to sub-pulses.

Figure 7A:
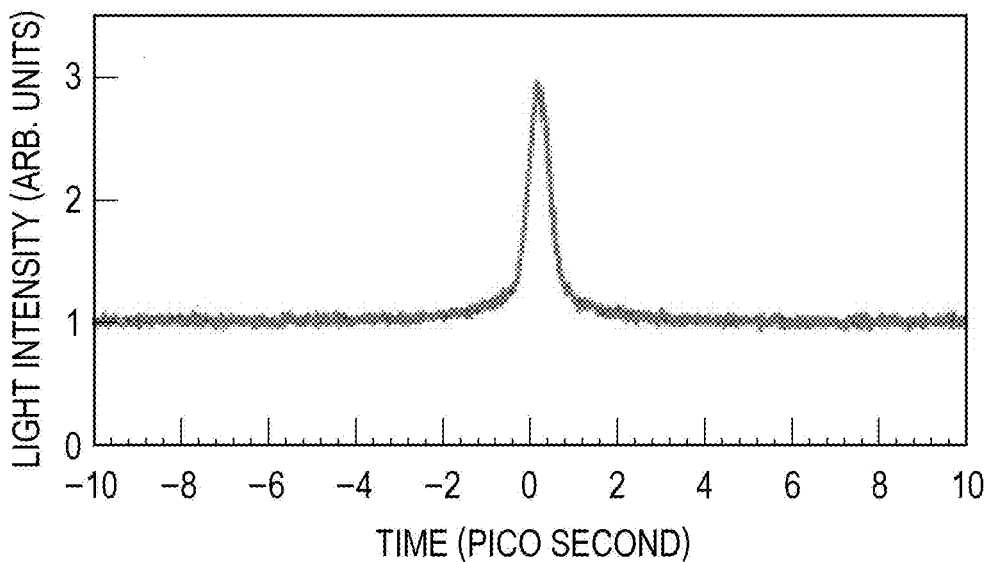
FIGS. 7A and 7B are respectively a diagram illustrating a correlation waveform of light pulses when a generated pulse is only a main pulse and the pulse time width is made as low as possible, and a diagram illustrating an optical spectrum of an optical spectrum in the semiconductor laser apparatus assembly according to Embodiment 1.
Figure 7B:
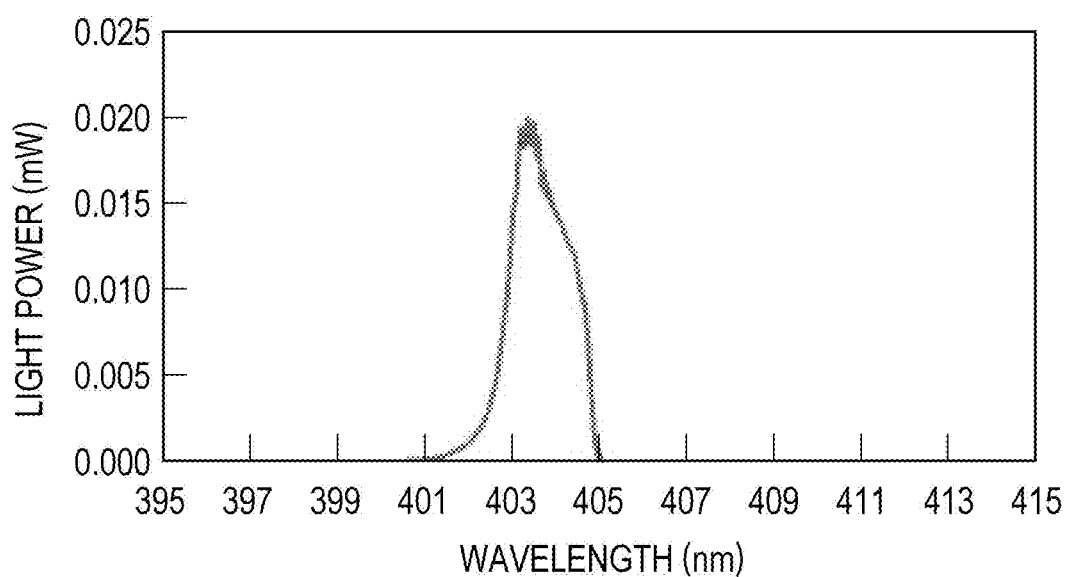

Therefore, by setting an appropriate dispersion compensation amount (group velocity dispersion), more specifically, appropriately setting the distance L, only the main pulse can be generated, and the pulse time width can be made as short (narrow) as possible. A correlation waveform of light pulses in this case is shown in FIG. 7A. In addition, the transverse axis of FIG. 7A expresses time (unit: picosecond) and the longitudinal axis expresses a light intensity (unit: arbitrary). Here, the gain current I is 120 milliamperes, and the reverse bias voltage $V_{sa}$ is −7 V. The group velocity dispersion is −0.0630 ps$^2$, the full width at half maximum of the obtained light pulse is 0.57 picoseconds, and the pulse time width of the sech$^2$ shape is 0.37 picoseconds. In addition, FIG. 7B shows a corresponding optical spectrum. It can be seen that the spectral width is 1.56 nm, the time-bandwidth product is obtained as 1.06, and the emitted pulses show chirping. Average power after being transmitted through the wavelength selecting means 200 is 3.0 milliwatts, and peak power of the emitted light pulses is obtained as about 8 watts.

A light density at the second end surface when such light pulses are generated can be obtained as follows. The light density at the second end surface is defined as a value obtained by dividing light power by the cross-sectional area on a near field pattern of the laser light at the second end surface. In addition, the light power at the second end surface is required to be divided by efficiency at the time of being output from the resonator, and is about 5% in the present configuration. The cross-sectional area on a near field pattern indicates a cross-sectional area when a light intensity on the near field pattern is 1/e$^2$ times the peak power. The cross-sectional area on the near field pattern in the mode-locked semiconductor laser device according to Embodiment 1 is 1.08 μm$^2$, and the light density is calculated as about 15 gigawatts/cm$^2$ when this value is used.

Hereinafter, driving conditions for generating light pulses of subpicoseconds will be described.

Figure 8A:
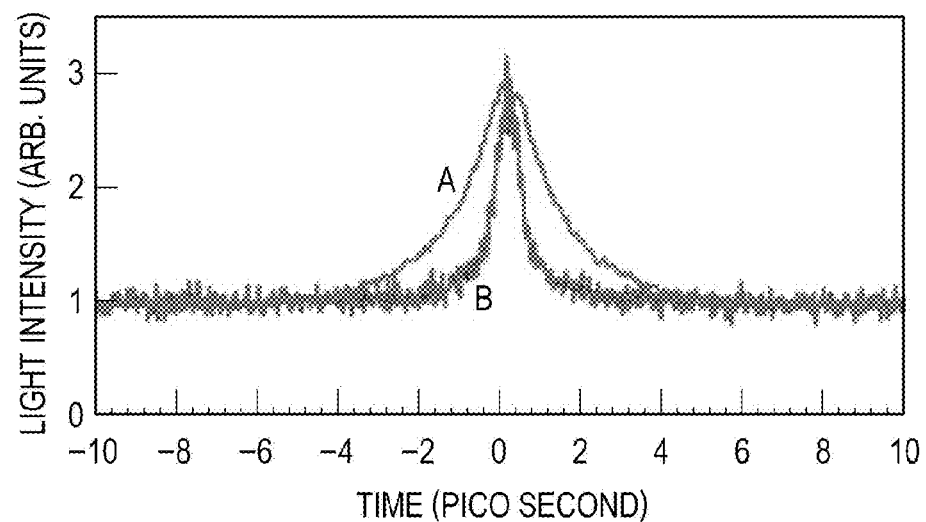
FIGS. 8A and 8B are respectively a diagram illustrating a correlation waveform of light pulses in a certain driving condition and a diagram illustrating an optical spectrum of the light pulses in the semiconductor laser apparatus assembly according to Embodiment 1.
Figure 8B:
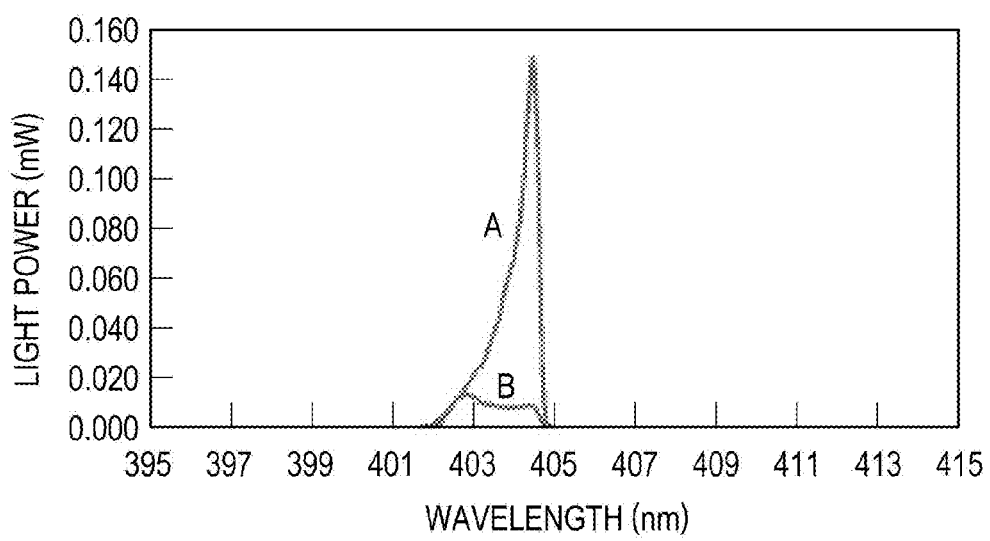

The driving conditions for generating light pulses of subpicoseconds are dependent on the gain current I, the reverse bias voltage $V_{sa}$, and the dispersion compensation amount (group velocity dispersion) [in other words, the distance L]. FIG. 8A shows a correlation waveform of light pulses under driving conditions of the lowest gain current I (100 milliamperes) and reverse bias voltage $V_{sa}$ (−5.5 volts) capable of obtaining laser oscillation, and the distance L=14.1 mm, and FIG. 8B shows an optical spectrum. In addition, in FIGS. 8A and 8B, "A" indicates a state before being transmitted through the wavelength selecting means 200, "B" indicates a state after being transmitted through the wavelength selecting means 200, and the light power is 7.04 milliwatts and 1.5 milliwatts, respectively. A pulse time width of the light pulses after being transmitted through the wavelength selecting means 200 is 0.42 picoseconds. In addition, a group velocity dispersion at this time is −0.0753 ps$^2$. Further, the driving conditions are dependent on a feedback amount of the external resonator as well as the gain current I, the reverse bias voltage $V_{sa}$, and the dispersion compensation amount (group velocity dispersion), and thus lower limit values of the driving conditions capable of obtaining laser oscillation are not limited to the above values.

Figure 9A:
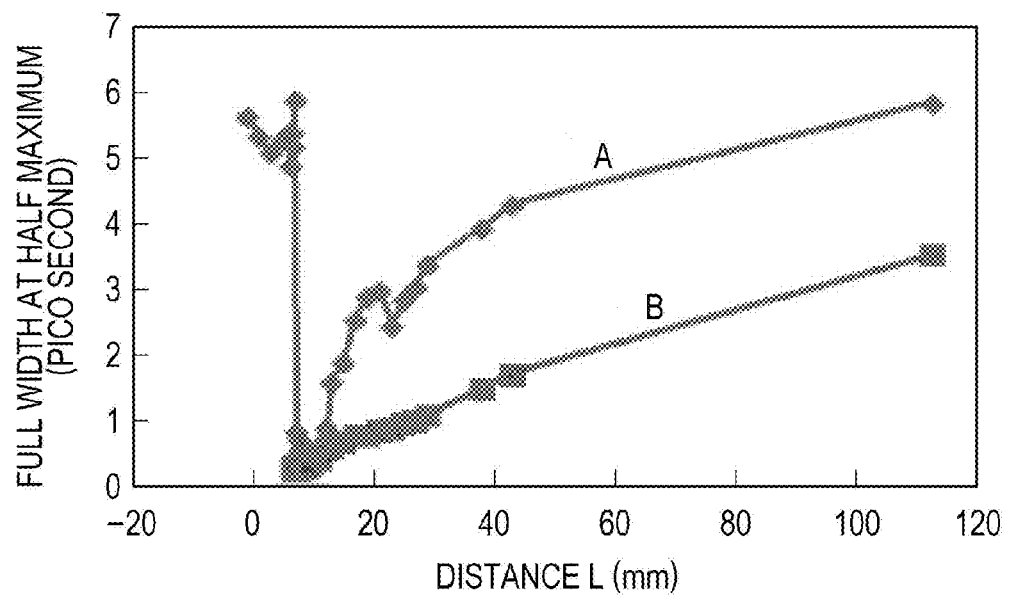
FIGS. 9A and 9B are respectively a diagram illustrating a result that a relationship between the distance L and a full width at half maximum has been obtained and a diagram illustrating a result that a relationship between a group velocity dispersion and a full width at half maximum of light pulses has been obtained in the semiconductor laser apparatus assembly according to Embodiment 1.
Figure 9B:
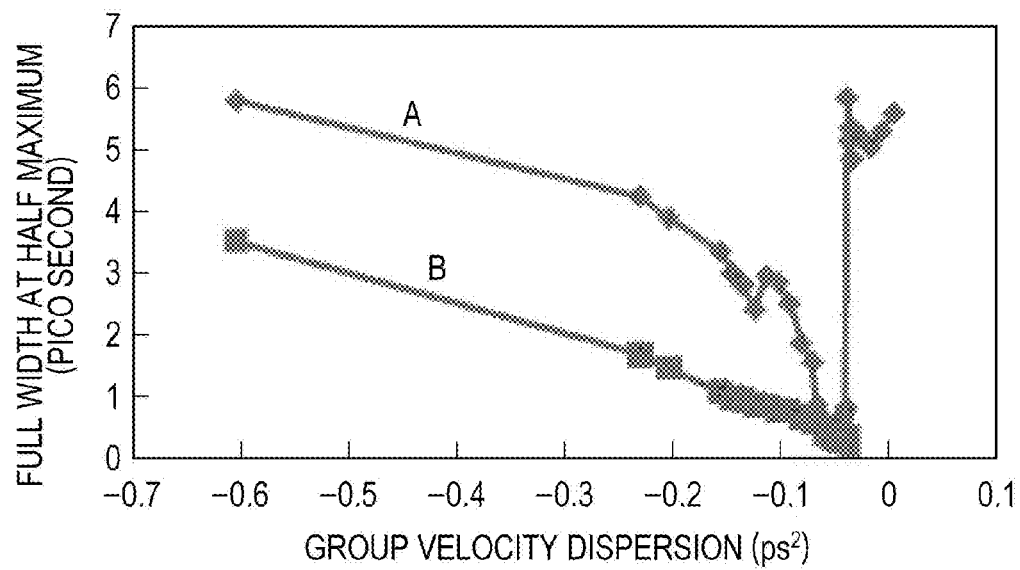

Under the conditions of the reverse bias voltage $V_{sa}$=−7 volts, and the gain current I=130 milliamperes, a result of obtaining a relationship between the distance L and the full width at half maximum of the light pulses is shown in FIG. 9A, and a result of obtaining a relationship between the group velocity dispersion and the full width at half maximum of the light pulses is shown in FIG. 9B. In addition, FIGS. 9A and 9B are graphs created based on the same data. Further, "A" indicates a state before being transmitted through the wavelength selecting means 200, and "B" indicates a state after being transmitted through the wavelength selecting means 200. Furthermore, the distance L and the group velocity dispersion shown in FIGS. 9A and 9B have the following relationship.

$$\text{Group velocity dispersion (ps}^2\text{)}=-5.352\times10^{-3}\times L \text{ (mm)}$$

In addition, the group velocity dispersion=$-(\lambda^3/(\pi \cdot c^2 \cdot d_G^2 \cdot \cos^2\theta_r)) \cdot 2 \cdot L$ is generally given.

Here,
λ: Wavelength
c: Velocity of light
$d_G$: Interval of grooves of the diffraction grating
$\theta_r$: Angle of diffracted light to normal line of diffraction grating From FIG. 9A, it can be seen that the pulse full width at half maximum is rapidly decreased from a certain distance L and then has the minimum value. It can be seen that the above-described side pulses appear while a dispersion compensation amount corresponding to the vicinity of the dispersion compensation amount (also referred to as a "minimum dispersion compensation amount", in the example shown in FIG. 9A, the distance L=11.8 mm) corresponding to the pulse full width at half maximum slightly varies. In addition, in a dispersion compensation amount larger than the minimum dispersion compensation amount, a variation in the pulse full width at half maximum with respect to the dispersion compensation amount is smaller than a variation in the pulse full width at half maximum in a range of a dispersion compensation amount smaller than the minimum dispersion compensation amount. Furthermore, in a range of a dispersion compensation amount larger than the minimum dispersion compensation amount, it is possible to adjust chirping of pulses generated by varying a dispersion compensation amount. Light pulses having the pulse full width at half maximum of the minimum value are transmitted through the wavelength selecting means 200, and only a short wavelength component is extracted, thereby obtaining a correlation waveform indicating clean light pulses without skirts. In addition, it is possible to obtain a correlation waveform indicating clean light pulses without skirts at a negative side group velocity dispersion from the group velocity dispersion where a pulse time width is the minimum.

Alternatively, from FIG. 9B, in a state before being transmitted through the wavelength selecting means 200, if a minimum group velocity dispersion of the dispersion compensation optical system 110 when a pulse time width of laser light output to the outside of the system becomes the minimum value $PW_{min}$ is $GVD_{min}$, a pulse time width of the laser light when a group velocity dispersion of the dispersion compensation optical system 110 is a negative first predetermined value $GVD_1$, is $PW_1$, and a pulse time width of the laser light when a group velocity dispersion of the dispersion compensation optical system 110 is a negative second predetermined value $GVD_2$ is $PW_2$, for example, the following is satisfied.

$(PW_1-PW_{min})/|GVD_{min}-GVD_1| \geq 2 \times (PW_2-PW_{min})/|GVD_2-GVD_{min}|$ where $|GVD_1/GVD_{min}|=0.53$ and $|GVD_2/GVD_{min}|=2.1$.

Figure 10A:
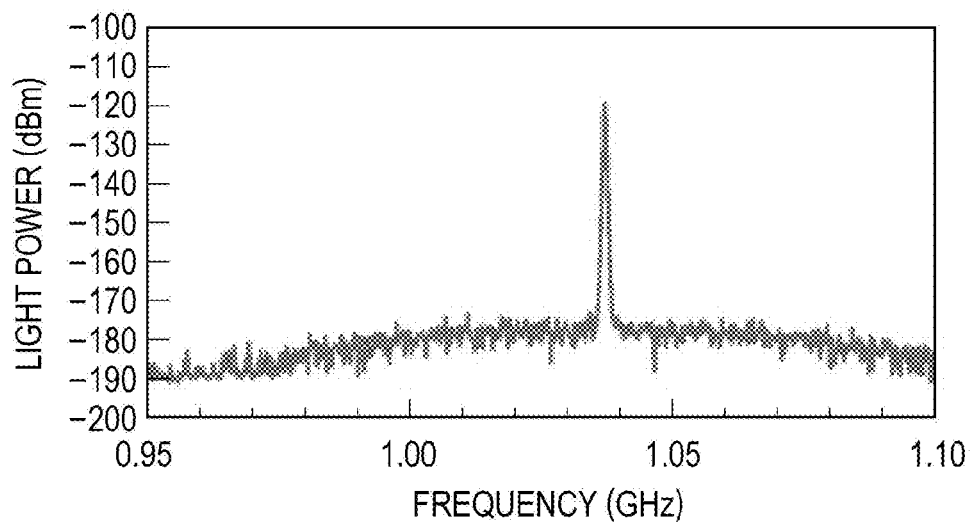
FIGS. 10A and 10B are respectively a diagram illustrating RF spectra when a group velocity dispersion is $-0.0257$ ps$^2$ and a diagram illustrating RF spectra when a group velocity dispersion is −0.064 ps² in the semiconductor laser apparatus assembly according to Embodiment 1.
Figure 10B:
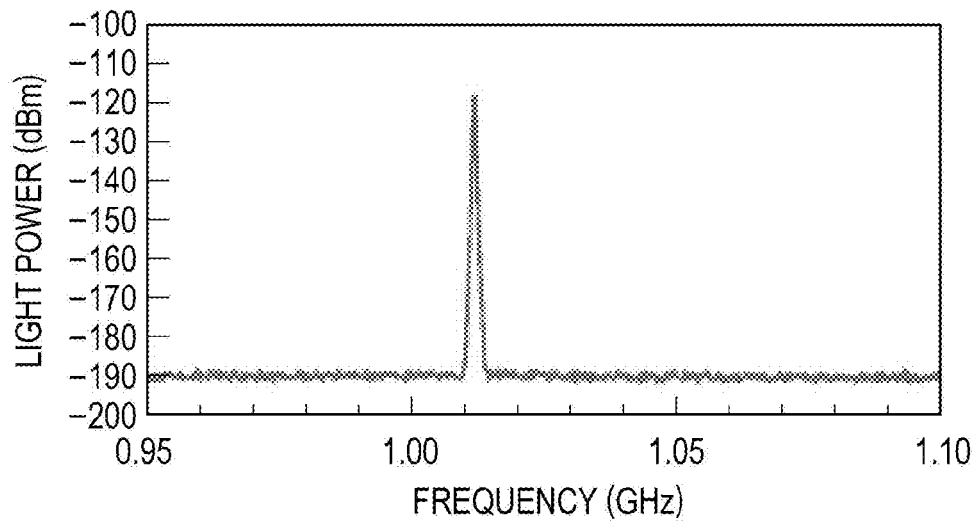

Specifically, $PW_1=5.3$ picoseconds $PW_2=2.9$ picoseconds $PW_{min}=0.4$ picoseconds $GVD_1=-0.0255$ ps$^2$ $GVD_2=-0.101$ ps$^2$ $GVD_{min}=-0.048$ ps$^2$ Although a correlation waveform indicating clean light pulses without skirts can be obtained from a group velocity dispersion where a pulse time width is the minimum in a negative side group velocity dispersion, a range of such group velocity dispersion can be examined using an RF spectrum of light pulses output from the mode-locked semiconductor laser device. Specifically, if light pulses are received by a high speed photodiode of which a bandwidth is equal to or more than the repetition frequency, a spectrum for the repetition cycle of the light pulses can be obtained. The repetition cycle is determined based on the external resonator length X', and since there are various dispersive media in the mode-locked semiconductor laser device, typically, there is a deviation depending on a wavelength for the lap time. The deviation of the repetition frequency is reflected on the RF spectrum along with the repetition frequency. FIG. 10A shows an RF spectrum when a group velocity dispersion is −0.0257 ps$^2$, and FIG. 10B shows an RF spectrum when a group velocity dispersion is −0.064 ps$^2$. A group velocity dispersion which gives the spectrum in FIG. 10A is smaller than a group velocity dispersion at a position where the pulse time width in FIG. 9B indicates the minimum (an absolute value of the group velocity dispersion is great). As shown in FIG. 10B, it can be seen that a noise component indicating fluctuation of the lap time with respect to the main peak of the repetition frequency is suppressed by 60 dB or more depending on the group velocity dispersion in the RF spectrum. In other words, it can be seen that a noise component of laser light output to the outside of the system with respect to the main oscillation frequency is equal to or less than −60 dB. In addition, it can be also seen that an operation is preferably performed at the minimum group velocity dispersion $GVD_{min}$ where the pulse time width of the laser light output to the outside of the system is the minimum value $PW_{min}$ or at the vicinity thereof. In addition, the pulse time width indicating the minimum value is dependent on the gain current I, and, if the reverse bias voltage $V_{sa}$ is constant, the larger the gain current I, the smaller the pulse time width, and a generated light pulse is only a main pulse. A pulse time width (unit: picosecond) with respect to the gain current I (unit: milliampere) in a case of indicating the minimum pulse time width is shown in the following Table 2. In addition, in Table 2, the "pulse time width A" is a value (unit: picosecond) before being transmitted through the wavelength selecting means 200, and the "pulse time width B" is a value after being transmitted through the wavelength selecting means 200. In addition, the reverse bias voltage $V_{sa}$ is a constant value (−7 volts). Further, since the repetition frequency of laser pulses becomes twice at the border where a gain current value is 120 milliamperes, the oscillation characteristic is changed, and variations in the pulse time width B are discontinuous at the border of the current value.

TABLE 2

| Gain current I | Pulse time width A | Pulse time width B |
|---|---|---|
| 100 | 2.35 | 0.80 |
| 105 | 2.00 | 0.55 |
| 110 | 1.75 | 0.37 |
| 115 | 1.50 | 0.29 |
| 120 | 1.23 | 0.55 |
| 125 | 1.20 | 0.37 |
| 130 | 1.03 | 0.29 |

Figure 11:
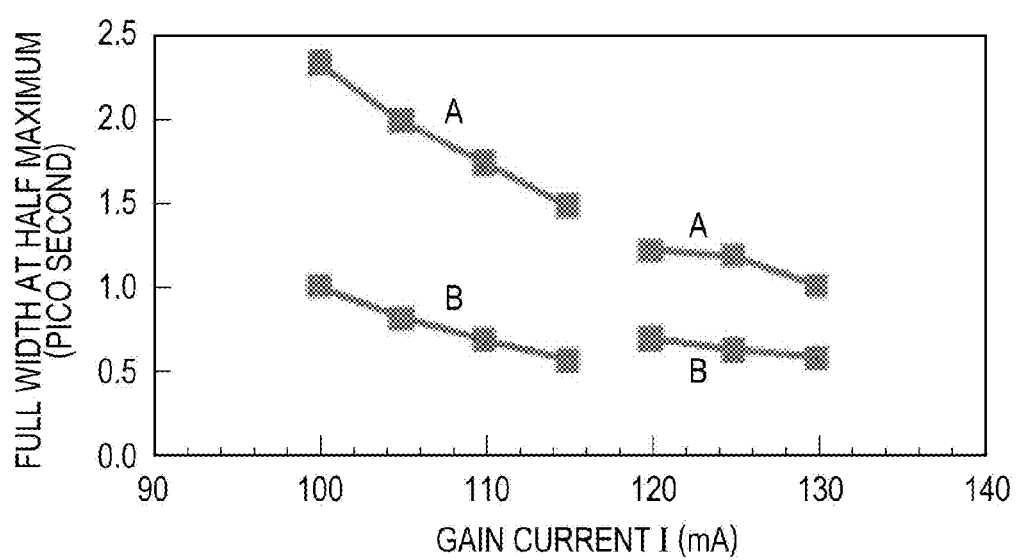
FIG. 11 is a diagram illustrating that a pulse time width which becomes the minimum due to an increase in a gain current is decreased in the semiconductor laser apparatus assembly according to Embodiment 1.

As such, the pulse time width which becomes the minimum tends to be decreased depending on the increase in the gain current I. FIG. 11 shows dependency of the pulse time width on the gain current I.

Here, as described above, it is preferable that the second electrode 62 having the separation resistivity of $1\times10^2 \Omega$ or more be formed on the second compound semiconductor layer 50. In a case of the GaN based semiconductor laser device, since the mobility in a compound semiconductor having a p-type conductivity type is small unlike in the GaAs based semiconductor laser device in the related art, the second electrode 62 formed thereon is separated by the separation groove 62C, and thereby the electrical resistivity between the first portion 62A and the second portion 62B of the second electrode 62 can be made to be ten times the electrical resistivity between the second electrode 62 and the first electrode 61, or the electrical resistivity between the first portion 62A and the second portion 62B of the second electrode 62 can be made to be $1\times10^2 \Omega$ or more, without causing the second compound semiconductor layer 50 with a p-type conductivity type to have high resistance through ion implantation.

Here, characteristics required for the second electrode 62 are as follows. That is to say, (1) the second electrode has a function as an etching mask when the second compound semiconductor layer 50 is etched, (2) the second electrode 62 can be wet-etched without causing deterioration in optical and electrical characteristics of the second compound semiconductor layer 50, (3) the second electrode expresses a contact resistivity of $10^{-2}$ $\Omega \cdot cm^2$ or less when a film is formed on the second compound semiconductor layer 50, (4) in a case of a laminate structure, a material forming a lower metal layer has a large work function, expresses a low contact resistivity relative to the second compound semiconductor layer 50, and can be wet-etched, and (5) in a case of a laminate structure, a material forming the upper metal layer is tolerant to (for example, a Cl$_2$ gas used in an RIE method) in etching when a ridge stripe structure is formed and can be wet-etched.

In Embodiment 1 or Embodiment 2 to Embodiment 4 described later, the second electrode 62 is formed of a Pd single layer with the thickness 0.1 μm.

In addition, the thickness of the p-type GaN/AlGaN superlattice clad layer 53 having a superlattice structure where a p-type GaN layer and a p-type AlGaN layer are alternately laminated is 0.7 μm or less, and, specifically, 0.4 μm, the thickness of the p-type GaN layer forming the superlattice structure is 2.5 nm, the thickness of the p-type AlGaN layer forming the superlattice structure is 2.5 nm, and a total number of layers of the p-type GaN layer and the p-type AlGaN layer is 160. In addition, the distance from the third compound semiconductor layer 40 to the second electrode 62 is 1 μm or less, and, specifically, 0.5 μm. Furthermore, the p-type AlGaN electron barrier layer 52, the p-type GaN/AlGaN superlattice clad layer 53, and the p-type GaN contact layer 54 forming the second compound semiconductor layer 50 are doped with Mg at $1\times10^{19}$ cm$^{-3}$ or more (specifically, $2\times10^{19}$ cm$^{-3}$), and the absorption coefficient of the second compound semiconductor layer 50 to light of the wavelength 405 nm is at least 50 cm$^{-1}$, and, specifically, 65 cm$^{-1}$. Further, although the second compound semiconductor layer 50 includes the non-doped compound semiconductor layers (the non-doped GaInN light guide layer 51 and the p-type compound semiconductor layers) from the third compound semiconductor layer 40, the distance (d) from the third compound semiconductor layer 40 to the p-type compound semiconductor layer (specifically, the p-type AlGaN electron barrier layer 52) is $1.2\times10^{-7}$ m or less, and, specifically, 100 nm.

Hereinafter, with reference to FIGS. 18A, 18B, 19A, 19B and 20, a description will be made of a manufacturing method of the mode-locked semiconductor laser device in Embodiment 1 or Embodiment 2 and Embodiment 3 described later. In addition, FIGS. 18A, 18B, 19A and 19B are schematic partial cross-sectional views when a substrate and the like are cut in the YZ plane, and FIG. 20 is a schematic partial cross-sectional view when the substrate and the like are cut in the XZ plane.

[Step-100]

Figure 18A:
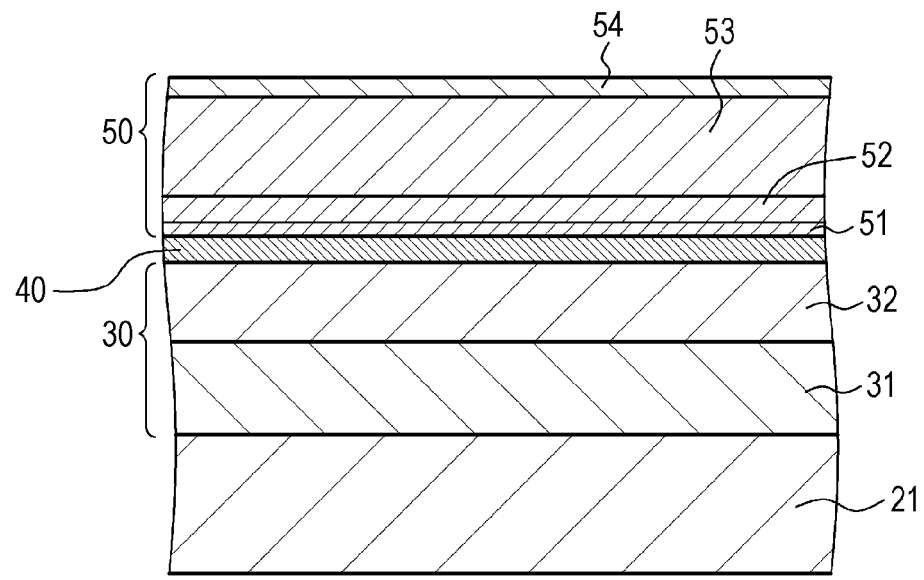
FIGS. 18A and 18B are schematic partial cross-sectional views of a substrate and the like for describing a manufacturing method of the mode-locked semiconductor laser device according to Embodiment 1.
Figure 18B:
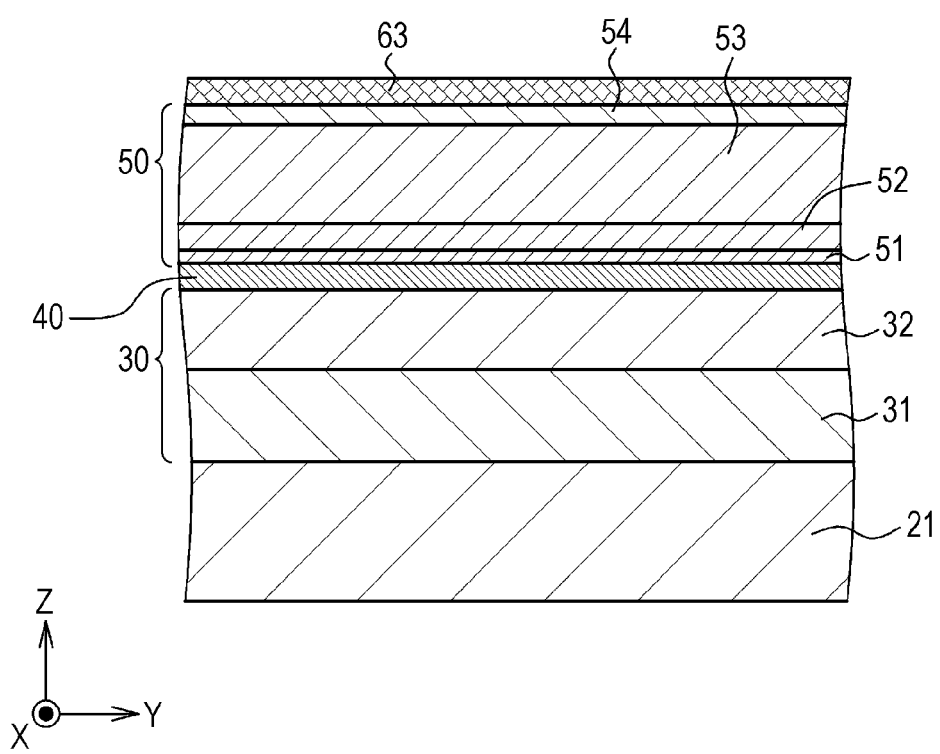
Figure 19A:
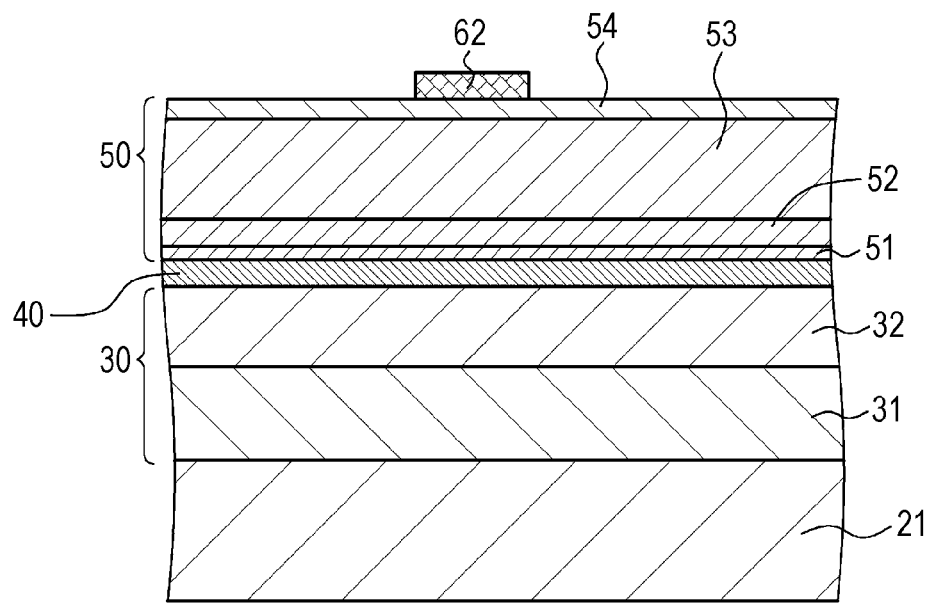
FIGS. 19A and 19B follow FIG. 18B and are schematic partial cross-sectional views of the substrate and the like for describing the manufacturing method of the mode-locked semiconductor laser device according to Embodiment 1.
Figure 19B:
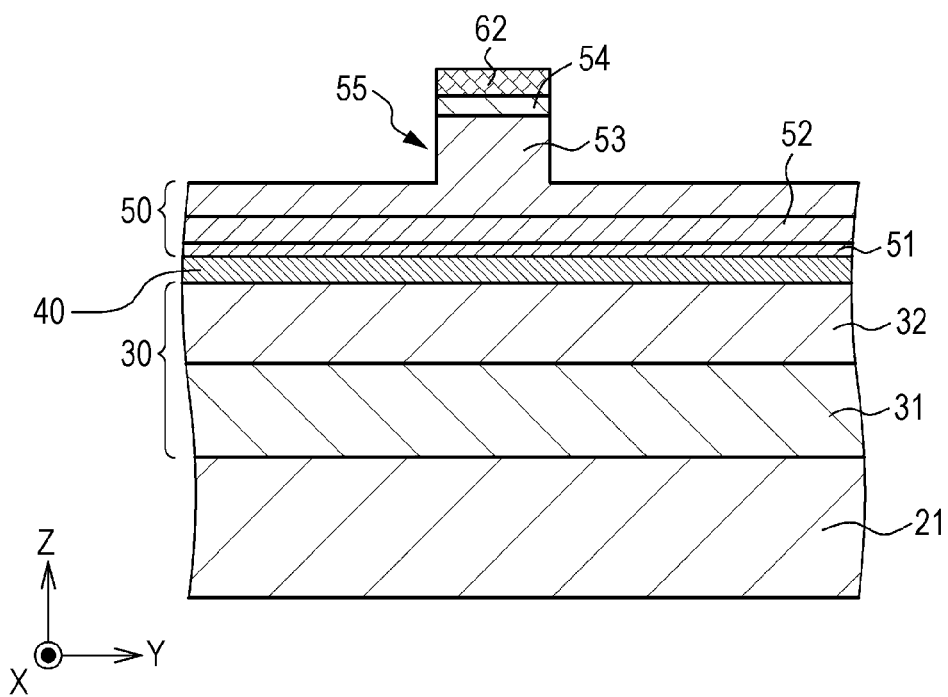

First, on a base, specifically, on the (0001) plane of the n-type GaN substrate 21, based on the well-known MOCVD method, there is a formation of a laminate structure formed by sequentially laminating the first compound semiconductor layer 30 having the first conductivity type (an n-type conductivity type) and made of a GaN based compound semiconductor; the third compound semiconductor layer (active layer 40) made of the GaN based compound semiconductor and constituting the emission region (gain region) 41 and the saturable absorption region 42; and the second compound semiconductor layer 50 having the second conductivity type (the p-type conductivity type) different from the first conductivity type and made of the GaN based compound semiconductor (refer to FIG. 18A).

[Step-110]

Thereafter, the strip-shaped second electrode 62 is formed on the second compound semiconductor layer 50. Specifically, a Pd layer 63 is entirely formed based on a vacuum deposition method (refer to FIG. 18B), and a strip-shaped resist layer for etching is formed on the Pd layer 63 on the basis of a photolithography technique. In addition, the Pd layer 63 which is not covered by the resist layer for etching is removed using aqua regia, and then the resist layer for etching is removed. In this way, a structure shown in FIG. 19A can be obtained. Further, the strip-shaped second electrode 62 may be formed on the second compound semiconductor layer 50 on the basis of a lift-off method.

[Step-120]

Next, at least a part of the second compound semiconductor layer 50 is etched using the second electrode 62 as an etching mask (specifically, a part of the second compound semiconductor layer 50 is etched) so as to form a ridge stripe structure. Specifically, a part of the second compound semiconductor layer 50 is etched using the second electrode 62 as an etching mask on the basis of an RIE method using a Cl$_2$ gas. In this way, a structure shown in FIG. 19B can be obtained. As such, since the ridge stripe structure is formed in a self-alignment manner using the second electrode 62 which is patterned in a strip shape as an etching mask, there is no occurrence of misalignment between the second electrode 62 and the ridge stripe structure.

[Step-130]

Thereafter, a resist layer 64 for forming a separation grove in the second electrode 62 is formed (refer to FIG. 20). In addition, the reference numeral 65 is an opening portion provided at the resist layer 64 in order to form the separation groove. Next, the separation groove 62C is formed in the second electrode 62 with a wet etching method by using the resist layer 64 as a wet etching mask such that the second electrode 62 is separated into the first portion 62A and the second portion 62B by the separation groove 62C. Specifically, the entirety is immersed into aqua regia for about ten seconds using the aqua regia as an etchant, thereby forming the separation groove 62C in the second electrode 62. Then, the resist layer 64 is removed. In this way, the structure shown in FIGS. 2 and 3 can be obtained. As such, by employing the wet etching method, unlike in the dry etching method, there is no occurrence of deterioration in optical and electrical characteristics of the second compound semiconductor layer 50. Therefore, there is no occurrence of deterioration in emission characteristics of the mode-locked semiconductor laser device. In addition, when the dry etching method is employed, there is concern that the internal loss $\alpha_i$ of the second compound semiconductor layer 50 may be increased, and thereby a threshold value voltage is increased or a light output may be reduced. Here, when an etching rate of the second electrode 62 is ER$_0$, and an etching rate of the laminate structure is ER$_1$, ER$_0$/ER$_1 \cong 1\times 10^2$.

As described above, there is high etching selectivity between the second electrode 62 and the second compound semiconductor layer 50, and thus the second electrode 62 can be reliably etched without etching the laminate structure (or slightly etched). Further, it is preferable to satisfy ER$_0$/ER$_1 \geq 1\times 10$, and, preferably, ER$_0$/ER$_1 \geq 1\times 10^2$.

The second electrode may have a laminate structure of a lower metal layer made of palladium (Pd) with the thickness 20 nm and an upper metal layer made of nickel (Ni) with the thickness 200 nm. Here, in wet etching using aqua regia, an etching rate of the nickel is about 1.25 times the etching rate of palladium.

[Step-140]

Thereafter, formation of n side electrodes, cleavage of the substrate, and the like are performed, and further packaging is performed, thereby manufacturing the mode-locked semiconductor laser device 10.

As a result of measuring the electrical resistivity between the second portion 62A and the second portion 62B of the second electrode 62 of the manufactured mode-locked semiconductor laser device 10 by the use of a four-terminal method, the electrical resistivity between the first portion 62A and the second portion 62B of the second electrode 62 was 15 kΩ when the width of the second electrode 62 was 20 µm. In addition, in the manufactured mode-locked semiconductor laser device 10, a DC current was made to flow from the first portion 62A of the second electrode 62 to the first electrode 61 via the emission region 41 so as to enter a forward bias state, and the reverse bias voltage V$_{sa}$ was applied between the first electrode 61 and the second portion 62B of the second electrode 62 so as to apply an electric field to the saturable absorption region 42, thereby performing a self-pulsation operation. That is to say, the electrical resistivity between the first portion 62A and the second portion 62B of the second electrode 62 is ten or more times the electrical resistivity between the second electrode 62 and the first electrode 61, or is $1\times 10^2$Ω or more. Therefore, it was possible to reliably suppress a flow of the leaked current from the first portion 62A of the second electrode 62 to the second portion 62B thereof, and, as a result, the emission region 41 was made to enter a forward bias state, and the saturable absorption region 42 could be made to reliably enter a reverse bias state, thereby reliably causing a single mode self-pulsation operation.

Embodiment 2

Embodiment 2 is a modification of Embodiment 1. In Embodiment 2 as well, laser light emitted from the mode-locked semiconductor laser device 10 is incident to a dispersion compensation optical system 120, a portion of the laser light incident to the dispersion compensation optical system 120 is emitted from the dispersion compensation optical system 120 and returns to the mode-locked semiconductor laser device 10, and the remainder of the laser light incident to the dispersion compensation optical system 120 is output to the outside of the system.

Figure 12A:
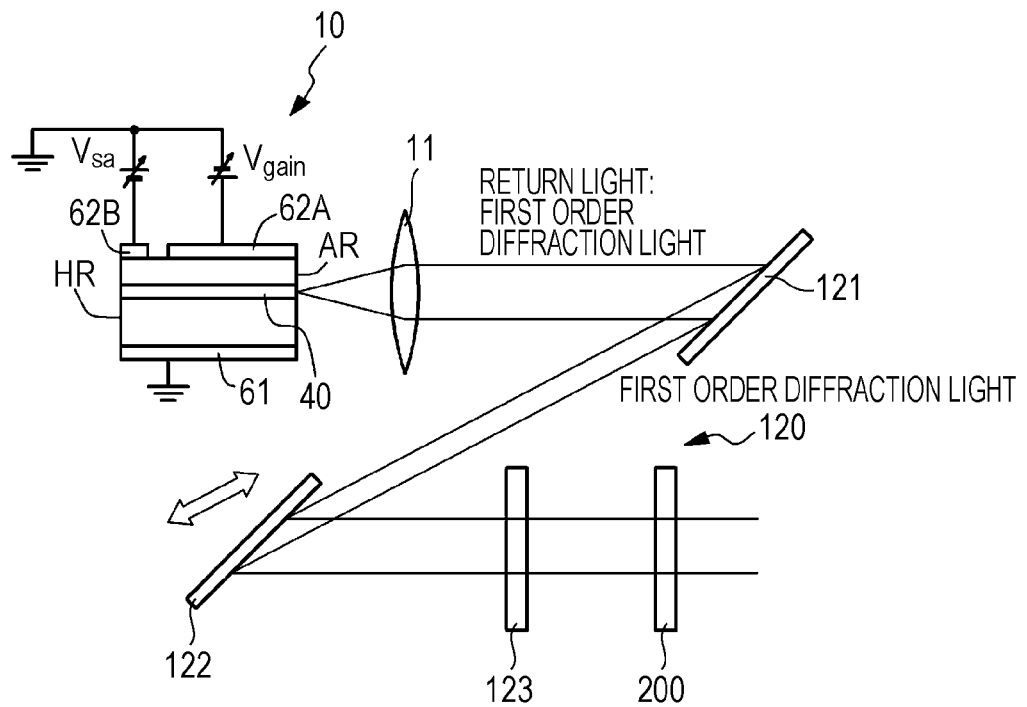
FIGS. 12A and 12B are respectively conceptual diagrams illustrating a semiconductor laser apparatus assembly according to Embodiment 2 and a modified example thereof.

In Embodiment 2, an external resonator structure is constituted by the dispersion compensation optical system 120 and a partial reflection mirror 123. In addition, specifically, the dispersion compensation optical system 120 includes a pair of diffraction gratings 121 and 122 as shown in a conceptual diagram of FIG. 12A. The pulse-shaped laser light emitted from the mode-locked semiconductor laser device 10 is impacted on the first diffraction grating 121 so as to emit first order or more diffracted light and is impacted on the second diffraction grating 122 so as to emit first order or more diffracted light, and then arrives at the partial reflection mirror 123 constituting one end of the external resonator. In addition, the first diffraction grating 121 and the second diffraction grating 122 are disposed in parallel to each other. In addition, a portion of the laser light arriving at the partial reflection mirror 123 passes through the partial reflection mirror 123 and is output to the outside of the system. On the other hand, the remainder of the laser light arriving at the partial reflection mirror 123 returns to the mode-locked semiconductor laser device 10 via the second diffraction grating 122 and the first diffraction grating 121. By changing a distance between the first diffraction grating 121 and the second diffraction grating 122, it is possible to change a group velocity dispersion in the dispersion compensation optical system 120.

In addition, the number of diffraction gratings to be used may be one. In this case, diffracted light from the diffraction grating is made to be incident to the partial reflection mirror, and laser light emitted from the mode-locked semiconductor laser device is made to be collected at the partial reflection mirror. The light reflected by the partial reflection mirror returns to the diffraction grating via the same light path, and thereby it is possible to achieve the same effect as in a case where diffraction gratings are opposite to each other. A dispersion compensation amount can be changed by changing a distance between the diffraction grating and the partial reflection mirror. Further, in this case, since the light emitted from the partial reflection mirror is divergent light, it is preferable to provide means for collimating light fluxes in addition to a resonator. In addition, in Embodiment 2, although a reflective diffraction grating is assumed, a transmissive diffraction grating may be used as long as it can constitute an external resonator having the same function.

Figure 12B:
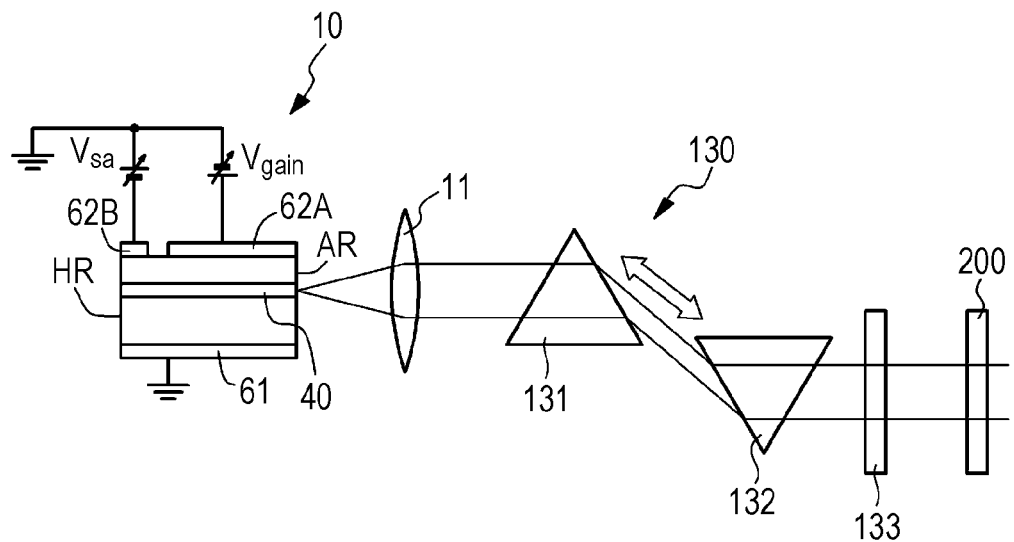

Alternatively, as shown in a conceptual diagram of FIG. 12B, a dispersion compensation optical system 130 is constituted by a pair of prisms 131 and 132. The pulse-shaped laser light emitted from the mode-locked semiconductor laser device 10 passes through the first prism 131 and further passes through the second prism 132, and then arrives at a partial reflection mirror 133 constituting one end of the external resonator. In addition, a disposition state of the first prism 131 and the second prism 132 is in point symmetry.

In addition, a portion of the laser light arriving at the partial reflection mirror 133 passes through the partial reflection mirror 133 and is output to the outside of the system. On the other hand, the remainder of the laser light arriving at the partial reflection mirror 133 returns to the mode-locked semiconductor laser device 10 via the second prism 132 and the first prism 131. By changing a distance between the first prism 131 and the second prism 132, it is possible to change a group velocity dispersion in the dispersion compensation optical system 120.

In addition, the number of prisms to be used may be one. In this case, laser light passing through the prism is made to be incident to the partial reflection mirror, and laser light emitted from the mode-locked semiconductor laser device is made to be collected at the partial reflection mirror. The light reflected by the partial reflection mirror returns to the prism via the same light path, and thereby it is possible to achieve the same effect as in a case where two prisms are provided. A dispersion compensation amount can be changed by changing a distance between the prism and the partial reflection mirror. Further, in this case, since the light emitted from the partial reflection mirror is divergent light, it is preferable to provide means for collimating light fluxes in addition to a resonator.

Figure 13:
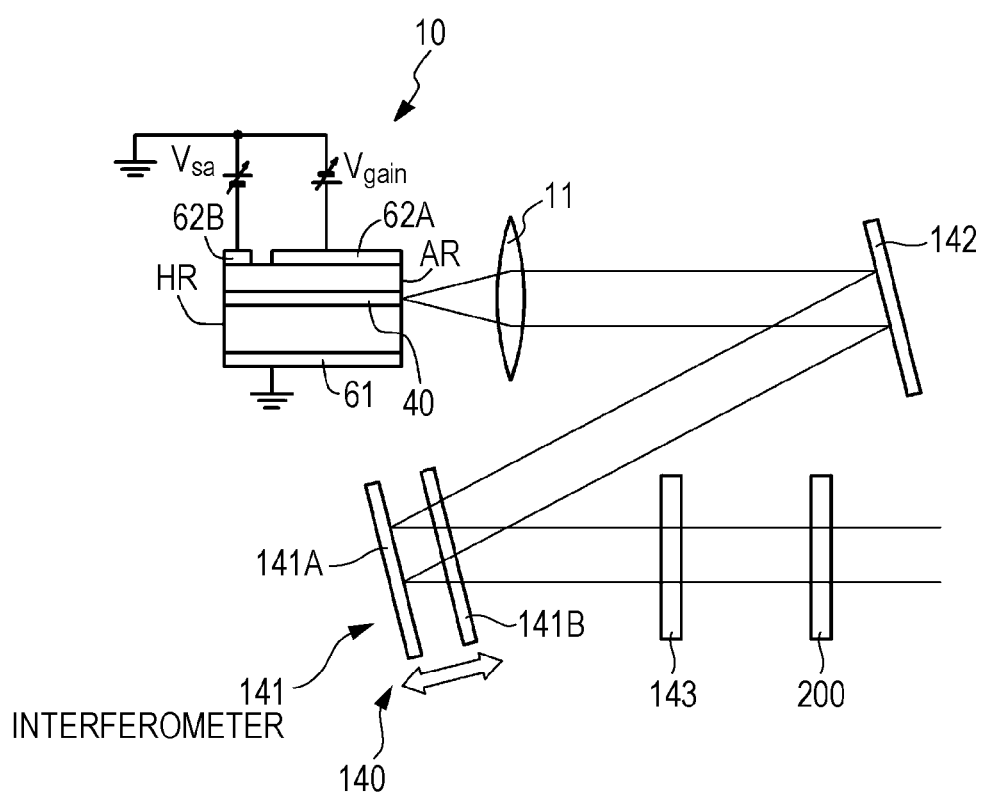
FIG. 13 is a conceptual diagram illustrating another modified example of the semiconductor laser apparatus assembly according to Embodiment 2.

Alternatively, as shown in a conceptual diagram of FIG. 13, a dispersion compensation optical system 140 is constituted by a Gires-Tournois type interferometer 141. The Gires-Tournois type interferometer 141 includes a reflection mirror 141A with a reflectance of 1 and a partial reflection mirror 141B with a reflectance less than 1. By controlling a distance between the reflection mirror 141A and the partial reflection mirror 141B, or, alternatively, adjusting an incidence angle of incident light, a group velocity dispersion in the dispersion compensation optical system 140 can be changed. The pulse-shaped laser light emitted from the mode-locked semiconductor laser device 10 is reflected by a plane mirror 142, passes through the partial reflection mirror 141B, passes through the partial reflection mirror 142 again after being reflected by the reflection mirror 141A, and then arrives at the partial reflection mirror 143 constituting the external resonator. In addition, a portion of the laser light arriving at the partial reflection mirror 143 passes through the partial reflection mirror 143 and is output to the outside of the system. On the other hand, the remainder of the laser light arriving at the partial reflection mirror 143 passes through the partial reflection mirror 141B, is reflected by the reflection mirror 141A, passes through the partial reflection mirror 141B and the plane mirror 142 again, and then returns to the mode-locked semiconductor laser device 10.

Alternatively, the dispersion compensation optical system is constituted by a dielectric multilayer film mirror. In this case, by adjusting an incidence angle of incident light, a group velocity dispersion in the dispersion compensation optical system can be changed.

Embodiment 3

Embodiment 3 is a modification of the mode-locked semiconductor laser device described in Embodiment 1, and relates to a mode-locked semiconductor laser device with a third configuration. In Embodiment 1, the mode-locked semiconductor laser device 10 has been provided on the (0001) plane or the C plane of the n-type GaN substrate 21 which is a polar crystal plane. However, if such a substrate is used, there are cases where it is difficult to electrically control saturable absorption due to a QCSE (Quantum-Confined Stark Effect) resulting from an internal electric field caused by piezoelectric polarization and spontaneous polarization in the active layer 40. In other words, in some cases, it was found that it is necessary to increase a value of the DC current made to flow to the first electrode and a value of the reverse bias voltage applied to the saturable absorption region in order to achieve a self-pulsation operation and a mode locking operation, sub-pulse components accompanied by the main pulse are generated, or it is difficult to synchronize an external signal with light pulses.

In addition, in order to prevent these phenomena, it has been proved that it is preferable to optimize the thickness of the well layer forming the active layer 40 and to optimize impurity doping concentration in the barrier layer forming the active layer 40.

Specifically, the thickness of the well layer forming the GaInN quantum well active layer is 1 nm or more and 10.0 or less, and, preferably, 1 nm or more and 8 nm or less. As such, the thickness of the well layer is made to be small, and thereby it is possible to reduce an influence of piezoelectric polarization and spontaneous polarization. In addition, the impurity doping concentration of the barrier layer is $2 \times 10^{18}$ cm$^{-3}$ or more and $1 \times 10^{20}$ cm$^{-3}$ or less, and, preferably, $1 \times 10^{19}$ cm$^{-3}$ or more and $1 \times 10^{20}$ cm$^{-3}$ or less. Here, an example of the impurity may include silicon (Si) or oxygen (O). When such concentration is used as the impurity doping concentration of the barrier layer, carriers of the active layer can be increased, and thus it is possible to reduce an influence of piezoelectric polarization and spontaneous polarization.

In Embodiment 3, a configuration of the active layer 40 constituted by a GaInN quantum well active layer including a barrier layer of three layers (formed by Ga$_{0.98}$In$_{0.02}$N) and a well layer of two layers (formed by Ga$_{0.92}$In$_{0.08}$N) in a layer configuration shown in Table 3 is as follows. In addition, in a mode-locked semiconductor laser device of Reference Example 3, a configuration of the active layer 40 in the layer configuration shown in Table 2 is as follows. Specifically, the same configuration as in Embodiment 1 is employed.

TABLE 3

|  | Embodiment 3 | Reference Example 3 |
| --- | --- | --- |
| Well layer | 8 nm | 10.5 nm |
| Barrier layer | 12 nm | 14 nm |
| Impurity doping concentration of well layer | non-doped | non-doped |
| Impurity doping concentration of barrier layer | Si: $2 \times 10^{18}$ cm$^{-3}$ | non-doped |

In Embodiment 3, the thickness of the well layer is 8 nm, and the barrier layer is doped with Si at $2 \times 10^{18}$ cm$^{-3}$, thereby alleviating the QCSE in the active layer. On the other hand, in Reference Example 3, the thickness of the well layer is 10.5 nm, and the barrier layer is not doped with impurities.

The mode locking is determined depending on a DC current applied to the emission region and a reverse bias voltage $V_{sa}$ applied to the saturable absorption region in the same manner as Embodiment 1. Reverse bias voltage dependency of a relationship (L-I characteristic) between injected current and light output in Embodiment 3 and Reference Example 3 was measured. As a result, it was found that, in Reference Example 3, if the reverse bias voltage $V_{sa}$ is increased, a threshold value current where laser oscillation starts is gradually increased, and, variations in the lower reverse bias voltage $V_{sa}$ than in Embodiment 3 occur. This suggests that the saturable absorption effect is electrically controlled by the reverse bias voltage $V_{sa}$ in the active layer of Embodiment 3. However, in Reference Example 3 as well, a single mode (single basic transverse mode) self-pulsation operation and a mode locking (mode lock) operation are confirmed in a state where a reverse bias is applied to the saturable absorption region, and, needless to say, Reference Example 3 is also included in the present disclosure.

Embodiment 4

Embodiment 4 is a modification of Embodiment 1 to Embodiment 3. In Embodiment 4, the wavelength selecting means is not constituted by a bandpass filter but may be constituted by a diffraction grating 210, and an aperture 211 which selects first order or more diffracted light (first order diffracted light in Embodiment 4) emitted from the diffraction grating 210 as shown in conceptual diagrams of FIGS. 14A and 14B. The aperture 211 is constituted by, for example, a transmissive liquid crystal display device 212 having a plurality of segments. In addition, a lens 213 is disposed between the diffraction grating 210 and the aperture 211.

Figure 14A:
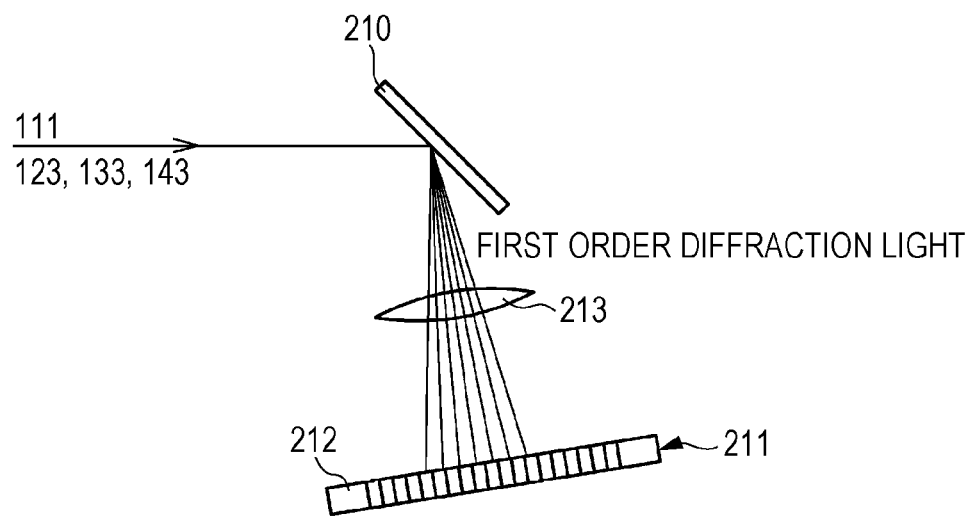
FIGS. 14A and 14B are conceptual diagrams illustrating wavelength selecting means in a semiconductor laser apparatus assembly according to Embodiment 4.
Figure 14B:
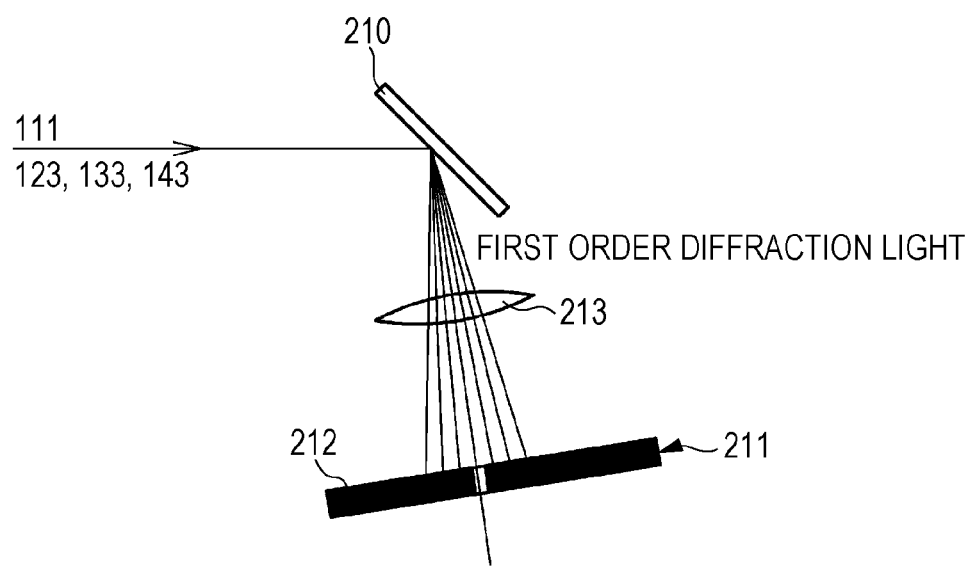

The wavelength of laser light emitted from the mode-locked semiconductor laser device 10 has any wavelength range. Therefore, the first order diffracted light which is diffracted in the diffraction grating 210 may be impacted on the aperture 211 at a plurality of regions as shown in FIG. 14A. That is to say, in the above-described Equation (A), there are a plurality of angles α, and thus there are a plurality of angles β. In addition, in FIGS. 14A and 14B, convergence and divergence of light paths by the lens 213 are disregarded. In addition, 0-th order diffracted light emitted from the diffraction grating 210 is not shown. Here, as shown in FIG. 14B, laser light is transmitted through a desired segment (forming the aperture 211) of the transmissive liquid crystal display device 212 having a plurality of segments, and thereby only laser light which is emitted from the mode-locked semiconductor laser device 10 and has a desired wavelength is finally output to the outside. As such, it is possible to select a wavelength by selecting the aperture 211.

As above, although the present disclosure has been described based on the preferred embodiments, the present disclosure is not limited to the embodiments. The semiconductor laser apparatus assembly, the configuration of the mode-locked semiconductor laser device, and the configuration of the structure described in the embodiments are only an example, and may be appropriately modified. Various values are shown in the embodiments, but they are only an example, and, for example, if a specification of the mode-locked semiconductor laser device to be used is changed, they are naturally changed.

Figure 15:
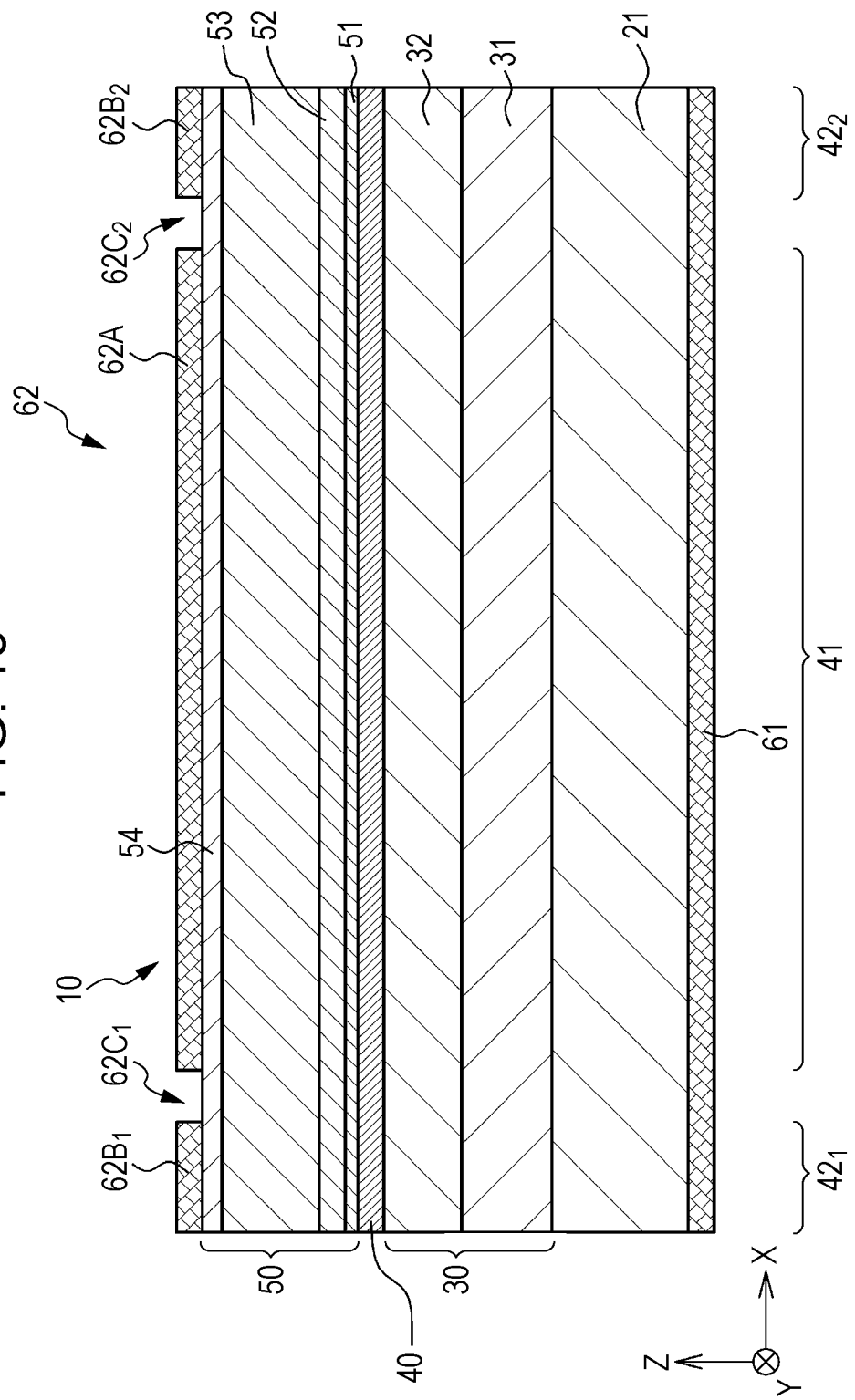
FIG. 15 is a schematic cross-sectional view in a direction where a resonator in a modified example of the mode-locked semiconductor laser device according to Embodiment 1 extends.
Figure 16:
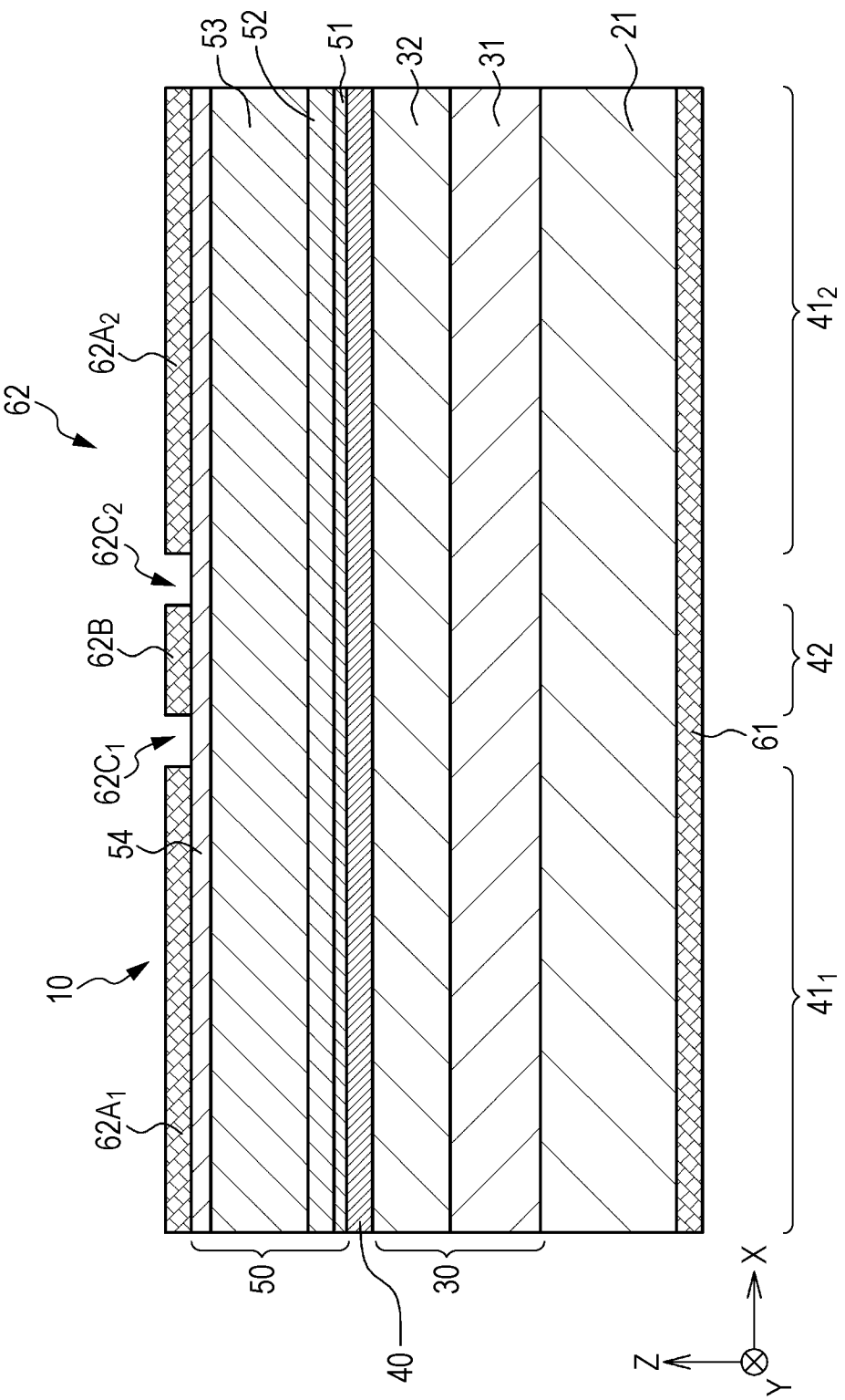
FIG. 16 is a schematic cross-sectional view in a direction where a resonator in another modified example of the mode-locked semiconductor laser device according to Embodiment 1 extends.

The number of the emission region 41 or the saturable absorption region 42 is not limited to 1. FIGS. 15 and 16 are schematic cross-sectional views of a mode-locked semiconductor laser device (multi-section type (multi-electrode type) semiconductor laser device) where a single first portion 62A of the second electrode and two second portions 62B$_1$ and 62B$_2$ of the second electrode are provided. In the mode-locked semiconductor laser device shown in FIG. 15, one end of the first portion 62A is opposite to one second portion 62B$_1$ with one separation groove 62C$_1$ interposed therebetween, and the other end of the first portion 62A is opposite to the other second portion 62B$_2$ with the other separation groove 62C$_2$ interposed therebetween. In addition, a single emission region 41 is interposed between two saturable absorption regions $42_1$ and $42_2$. Alternatively, FIG. 16 is a schematic cross-sectional view of a mode-locked semiconductor laser device where two first portions $62A_1$ and $62A_2$ of the second electrode and a single second portion 62B of the second electrode are provided. In the mode-locked semiconductor laser device, an end portion of the second portion 62B is opposite to one first portion $62A_1$ with one separation groove $62C_1$ interposed therebetween, and the other end of the second portion 62B is opposite to the other first portion $62A_2$ with the other separation groove $62C_2$ interposed therebetween. In addition, a single saturable absorption region 42 is interposed between two emission regions $41_1$ and $41_2$.

Figure 17:
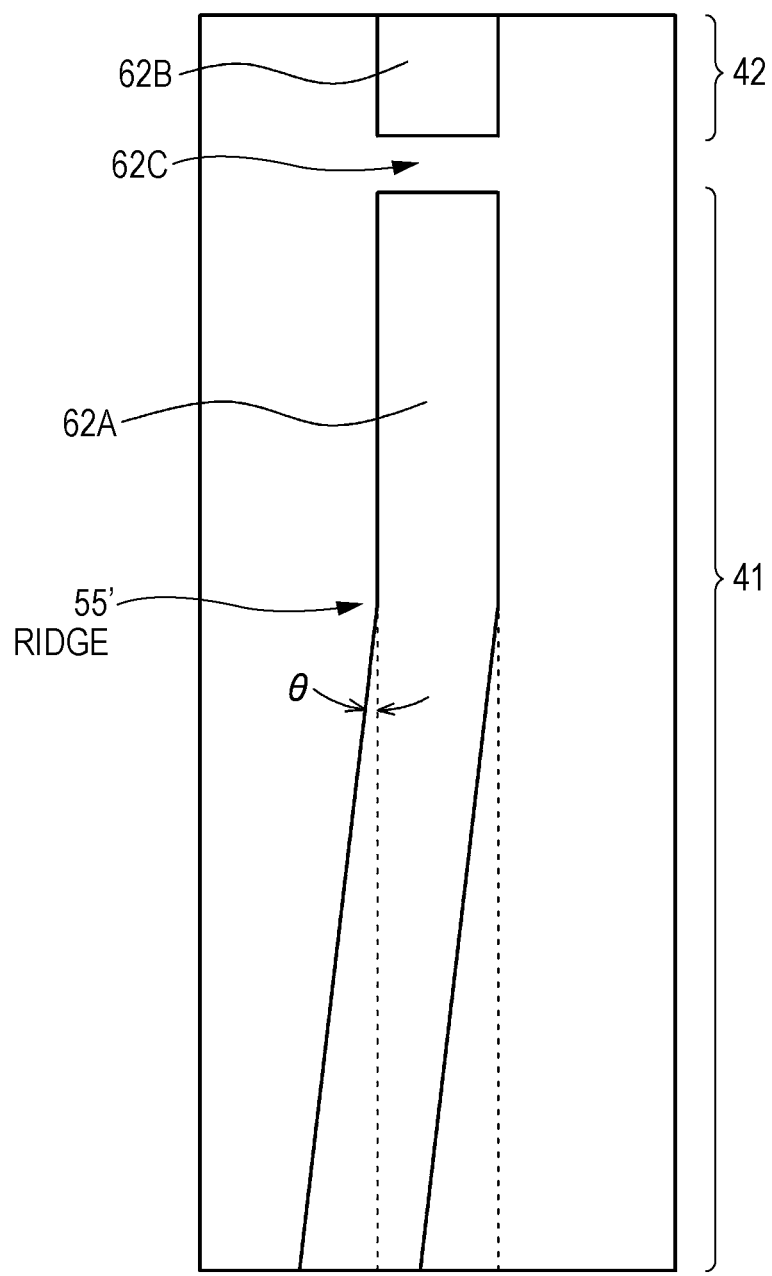
FIG. 17 is a schematic cross-sectional view in a direction where a ridge stripe structure in still another modified example of the mode-locked semiconductor laser device according to Embodiment 1 is viewed from the top.

The mode-locked semiconductor laser device may be a semiconductor laser device of a tilt ridge stripe type separate confinement heterostructure having a tilt waveguide. FIG. 17 is a schematic diagram where a ridge stripe structure 55' of the mode-locked semiconductor laser device is viewed from the top side. In the mode-locked semiconductor laser device, two ridge stripe structures with a straight line shape are combined, and a value of an angle θ where the two ridge stripe structures intersect each other is, for example, 0<θ≤10 (degrees), and, preferably, 0<θ≤6 (degrees).

By employing the tilt ridge stripe structure type, a reflectance of the second end surface on which non-reflection coat is formed can come closer to an ideal value of 0%, and, as a result, it is possible to obtain an advantage that generation of laser light circling the inside of the mode-locked semiconductor laser device can be prevented and thus generation of addition laser light accompanied by main laser light can be suppressed.

Although, in the embodiments, the mode-locked semiconductor laser device 10 is provided on the C plane or {0001} plane which is a polar plane of the n-type GaN substrate 21, alternatively, the mode-locked semiconductor laser device 10 may be provided on the A plane which is the {11-20} plane, the M plane which is the {1-100} plane, a non-polar plane such as the {1-102} plane, a semi-polar plane such as the {11-2n} plane including the {11-24} plane or the {11-22} plane, the {10-11} plane, or the {10-12} plane. Thereby, even if piezoelectric polarization and spontaneous polarization occur in the third compound semiconductor layer of the mode-locked semiconductor laser device 10, piezoelectric polarization does not occur in the thickness direction of the third compound semiconductor layer, but the piezoelectric polarization occurs in a direction substantially perpendicular to the thickness direction of the third compound semiconductor layer, thereby eliminating adverse effects caused by the piezoelectric polarization and spontaneous polarization. In addition, the {11-2n} plane indicates a non-polar plane which forms nearly 40 degrees with respect to the C plane. In addition, if the mode-locked semiconductor laser device 10 is provided on a non-polar plane or a semi-polar plane, as described in Embodiment 3, it is possible to get rid of the limitation (1 nm or more and 10 nm or less) in the thickness of the well layer and the limitation ($2 \times 10^{18}$ $cm^3$ or more and $1 \times 10^{20}$ $cm^{-3}$ or less) in the impurity doping concentration of the barrier layer.

In addition, the present disclosure may have the following configurations.

In an embodiment, a semiconductor laser apparatus is provided. The semiconductor laser apparatus comprising a mode-locked semiconductor laser device and an external resonator including a dispersion compensation system, wherein the semiconductor laser apparatus is configured to generate self modulation, to introduce a negative group velocity dispersion into the external resonator, and to provide spectral filtering after the external resonator.

In an embodiment, wherein the mode-locked semiconductor laser device is a bisectional laser device.

In an embodiment, the bisectional laser device includes a gallium nitride based laser diode.

In an embodiment, the gallium nitride based laser diode is a GaInN laser diode.

In an embodiment, wavelength selecting means is provided and configured to provide spectral filtering.

In an embodiment, the wavelength selecting means includes any one of a bandpass filter, a diffraction grating, and an aperture.

In an embodiment, the mode-locked semiconductor laser device includes a laminate structure including a plurality of semiconductor layers, wherein at least one of the semiconductor layers is associated with at least one emission region and at least one saturable absorption region, and wherein the at least one emission region and the at least one saturable absorption region are arranged in parallel in a direction of the external resonator.

In an embodiment, the mode-locked semiconductor laser device has any one of a ridge stripe separate confinement heterostructure and a tilt ridge stripe separate confinement heterostructure.

In an embodiment, at least one separation groove is provided that separates an electrode associated with at least one of the semiconductor layers into at least a first portion and a second portion.

In an embodiment, the external resonator includes a first end surface of the mode-locked semiconductor laser device, and at least one of a reflection mirror and a partial reflection mirror.

In an embodiment, an external resonator length is a distance between the first end surface of the mode-locked semiconductor laser device, and at least one of the reflection mirror and the partial reflection mirror.

In an embodiment, the external resonator length is less than 1500 microns.

In an embodiment, the semiconductor laser apparatus is configured to vary the external resonator length thereby allowing introduction of the negative group velocity dispersion into the external resonator.

In an embodiment, the dispersion compensation optical system includes at least one of a diffraction grating, a prism, an interferometer, a reflection mirror, and a condensing means.

In an embodiment, the diffraction grating includes at least one of a reflective diffraction grating and a transmissive diffraction grating.

In an embodiment, the semiconductor laser apparatus is configured to allow generation of an optical pulse at a pulse time width level on order of a femtosecond.

In another embodiment, a method of generating an optical pulse is provided. The method includes providing a semiconductor laser apparatus including a mode-locked semiconductor laser device, an external resonator, and a dispersion compensation optical system in the external resonator; and generating the optical pulse by utilizing the semiconductor laser apparatus to generate self modulation, to introduce a negative group velocity dispersion into the external resonator, and to provide spectral filtering after the external resonator.

In an embodiment, generating the optical pulse having a pulse time width on order of a femtosecond is further provided.

In an embodiment, the mode-locked semiconductor laser device is a bisectional laser device.

In an embodiment, the bisectional laser device includes a gallium nitride based laser diode.

In an embodiment, the mode-locked semiconductor laser device includes a laminate structure including a plurality of semiconductor layers, wherein at least one of the semiconductor layers is associated with at least one emission region and at least one saturable absorption region, and wherein the at least one emission region and the at least one saturable absorption region are arranged in parallel in a direction of the external resonator.

In an embodiment, the external resonator includes a first end surface of the mode-locked semiconductor laser device, and at least one of a reflection mirror and a partial reflection mirror.

In an embodiment, an external resonator length is a distance between the first end surface of the mode-locked semiconductor laser device, and at least one of the reflection mirror and the partial reflection mirror.

In an embodiment, the external resonator length is less than 1500 microns.

In an embodiment, varying the external resonator length thereby allowing introduction of the negative group velocity dispersion into the external resonator is provided.

[1]<<Semiconductor Laser Apparatus Assembly: Another Aspect>>

A semiconductor laser apparatus assembly including:

a current injection type mode-locked semiconductor laser device of which a light density is $1\times10^{10}$ watts/cm$^2$ or more and a carrier density is $1\times10^{19}$/cm$^3$ or more; and a dispersion compensation optical system to and from which laser light emitted from the mode-locked semiconductor laser device is incident and is emitted.

[2]

The semiconductor laser apparatus assembly set forth in [1], wherein the mode-locked semiconductor laser device includes a saturable absorption region.

[3]

The semiconductor laser apparatus assembly set forth in [2], wherein the mode-locked semiconductor laser device has a laminate structure formed by sequentially laminating a first compound semiconductor layer made of a GaN based compound semiconductor and having a first conductivity type;

a third compound semiconductor layer made of a GaN based compound semiconductor; and a second compound semiconductor layer made of a GaN based compound semiconductor and having a second conductivity type different from the first conductivity type.

[4]

The semiconductor laser apparatus assembly set forth in [3], wherein a group velocity dispersion in the dispersion compensation optical system has a negative value.

[5]

The semiconductor laser apparatus assembly set forth in any one of [1] to [4], wherein the semiconductor laser apparatus assembly is operated at a group velocity dispersion where a pulse time width of laser light output to the outside of the system is the minimum value, or at the vicinity thereof.

[6]

The semiconductor laser apparatus assembly set forth in any one of [1] to [5], further including wavelength selecting means, wherein the wavelength selecting means extracts a short wavelength component of laser light output to the outside of the system.

[7]

The semiconductor laser apparatus assembly set forth in any one of [1] to [6], wherein laser light emitted from the mode-locked semiconductor laser device is incident to the dispersion compensation optical system, and wherein a portion of the laser light incident to the dispersion compensation optical system is emitted from the dispersion compensation optical system and returns to the mode-locked semiconductor laser device, and the remainder of the laser light incident to the dispersion compensation optical system is output to the outside of the system.

[8]<<Semiconductor Laser Apparatus Assembly: Further Aspect>>

A semiconductor laser apparatus assembly including:

a current injection type mode-locked semiconductor laser device; and a dispersion compensation optical system to and from which laser light emitted from the mode-locked semiconductor laser device is incident and is emitted, wherein, when a group velocity dispersion of the dispersion compensation optical system monotonously varies from a first predetermined value $GVD_1$ to a second predetermined value $GVD_2$ (where $|GVD_1|<|GVD_2|$), a pulse time width of laser light output to the outside of the system from the mode-locked semiconductor laser device is reduced and is then increased exceeding the minimum value $PW_{min}$.

[9]

The semiconductor laser apparatus assembly set forth in [8], wherein, if a minimum group velocity dispersion of a dispersion compensation optical system when a pulse time width of laser light output to the outside of the system becomes the minimum value $PW_{min}$ is $GVD_{min}$, a pulse time width of the laser light when a group velocity dispersion of the dispersion compensation optical system is a negative first predetermined value $GVD_1$ is $PW_1$, and a pulse time width of the laser light when a group velocity dispersion of the dispersion compensation optical system is a negative second predetermined value $GVD_2$ is $PW_2$, the following is satisfied.

$$(PW_1-PW_{min})/|GVD_{min}-GVD_1| \geq 2\times(PW_2-PW_{min})/|GVD_2-GVD_{min}|$$

where $|GVD_1/GVD_{min}|=0.5$ and $|GVD_2/GVD_{min}|=2$

[10]

The semiconductor laser apparatus assembly set forth in [8] or [9], wherein the semiconductor laser apparatus assembly is operated at the minimum group velocity dispersion $GVD_{min}$ where a pulse time width of laser light output to the outside of the system is the minimum value $PW_{min}$, or at the vicinity thereof.

[11]

The semiconductor laser apparatus assembly set forth in any one of [8] to [10], wherein a noise component of laser light output to the outside of the system to a main oscillation frequency is −60 dB or less.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

10 MODE-LOCKED SEMICONDUCTOR LASER DEVICE, 11 COLLIMATING MEANS, 21 n-TYPE GaN SUBSTRATE, 22 GaN BUFFER LAYER, 30 FIRST COMPOUND SEMICONDUCTOR LAYER, 31 n-TYPE AlGaN CLAD LAYER, 32 n-TYPE GaN CLAD LAYER, 40 THIRD COMPOUND SEMICONDUCTOR LAYER (ACTIVE LAYER), 41, 41$_1$ AND 41$_2$ EMISSION REGION, 42, 42$_1$ AND 42$_2$ SATURABLE ABSORPTION REGION, SECOND COMPOUND SEMICONDUCTOR LAYER, 51 NON-DOPED GaInN LIGHT GUIDE LAYER, 52 p-TYPE AlGaN ELECTRON BARRIER LAYER (Mg DOPED), 53 p-TYPE GaN (Mg DOPED)/AlGaN SUPERLATTICE CLAD LAYER, 54 p-TYPE GaN CONTACT LAYER (Mg DOPED), 55 AND 55' RIDGE STRIPE STRUCTURE, 56 LAMINATE INSULATING FILM, 61 FIRST ELECTRODE, 62 SECOND ELECTRODE, 62A, 62A$_1$ AND 62A$_2$ FIRST PORTION OF SECOND ELECTRODE, 62B, 62B$_1$ AND 62B$_2$ SECOND PORTION OF SECOND ELECTRODE, 62C, 62C$_1$ AND 62C$_2$ SEPARATION GROOVE, 63 Pd SINGLE LAYER, 64 RESIST LAYER, 65 OPENING PORTION, 110, 120, 130 AND 140 DISPERSION COMPENSATION OPTICAL SYSTEM, 111, 121 AND 122 DIFFRACTION GRATING, 112 CONDENSING MEANS (LENS), 113 REFLECTION MIRROR (DIELECTRIC MULTI-LAYER FILM REFLECTION MIRROR), 123, 133 AND 143 PARTIAL REFLECTION MIRROR, 131 AND 132 PRISM, 141A REFLECTION MIRROR, 141B PARTIAL REFLECTION MIRROR, 142 PLANE MIRROR, 200 WAVELENGTH SELECTING MEANS (WAVELENGTH SELECTING DEVICE), 201 PLANE MIRROR, 210 DIFFRACTION GRATING, 211 APERTURE, 212 TRANSMISSIVE LIQUID CRYSTAL DISPLAY DEVICE, 213 LENS

The invention claimed is:
1. A semiconductor laser apparatus comprising:
   a mode-locked semiconductor laser device including a gallium nitride based laser diode; and
   an external resonator including a dispersion compensation system; and wavelength selecting means configured to provide spectral filtering,
   wherein the semiconductor laser apparatus is configured to generate self modulation, to introduce a negative group velocity dispersion into the external resonator, and to provide the spectral filtering after the external resonator, and
   wherein the dispersion compensation optical system is selected from the group consisting of
      (a) a system including a diffraction grating, a condensing lens, and a reflection mirror;
      (b) a system including first and second diffraction gratings, and a partial reflection mirror;
      (c) a system including first and second prisms, and a partial reflection mirror, and
      (d) a system including an interferometer,
   wherein a combination of the dispersion compensation system and the mode-locked semiconductor laser device allows generation of an optical pulse at a pulse time width level of 200 femtoseconds or less.
2. The semiconductor laser apparatus of claim 1, wherein the mode-locked semiconductor laser device is a bisectional laser device.
3. The semiconductor laser apparatus of claim 1, wherein the mode-locked semiconductor laser device includes a laminate structure including a plurality of semiconductor layers, wherein at least one of the semiconductor layers is associated with at least one emission region and at least one saturable absorption region, and wherein the at least one emission region and the at least one saturable absorption region are arranged in parallel in a direction of the external resonator.
4. The semiconductor laser apparatus of claim 3, wherein the mode-locked semiconductor laser device has any one of a ridge stripe separate confinement heterostructure and a tilt ridge stripe separate confinement heterostructure.
5. The semiconductor laser apparatus of claim 3, further comprising at least one separation groove that separates an electrode associated with at least one of the semiconductor layers into at least a first portion and a second portion.
6. The semiconductor laser apparatus of claim 1, wherein the external resonator includes a first end surface of the mode-locked semiconductor laser device, and at least one of a reflection mirror and a partial reflection mirror.
7. The semiconductor laser apparatus of claim 6, wherein an external resonator length is a distance between the first end surface of the mode-locked semiconductor laser device, and at least one of the reflection mirror and the partial reflection mirror.
8. The semiconductor laser apparatus of claim 6, wherein the external resonator length is less than 1500 microns.
9. The semiconductor laser apparatus of claim 8, wherein the semiconductor laser apparatus is configured to vary the external resonator length thereby allowing introduction of the negative group velocity dispersion into the external resonator.
10. The semiconductor laser apparatus of claim 1,
   wherein the dispersion compensation optical system includes a diffraction grating, a condensing lens, and a reflection mirror, and
   wherein the reflection mirror is a dielectric multilayer film reflection mirror.
11. The semiconductor laser apparatus of claim 1,
   wherein the dispersion compensation optical system includes first and second diffraction gratings, and a partial reflection mirror.
12. The semiconductor laser apparatus of claim 11,
   wherein the first diffraction grating and the second diffraction gratings are disposed in parallel to each other.
13. The semiconductor laser apparatus of claim 1,
   wherein the dispersion compensation optical system includes first and second prisms, and a partial reflection mirror.
14. The semiconductor laser apparatus of claim 13,
   wherein a disposition state of the first prism and the second prism is in point symmetry.
15. The semiconductor laser apparatus of claim 1,
   wherein the dispersion compensation optical system includes an interferometer.
16. The semiconductor laser apparatus of claim 15,
   wherein the interferometer includes a reflection mirror with a reflectance of 1 and a partial reflection mirror with a reflectance less than 1.
17. A method of generating an optical pulse, the method comprising:
   providing a semiconductor laser apparatus including a mode-locked semiconductor laser device including a gallium nitride based laser diode, an external resonator, a dispersion compensation optical system in the external resonator, and wavelength selecting means configured to provide spectral filtering; and
   generating the optical pulse by utilizing the semiconductor laser apparatus to generate self modulation, to introduce a negative group velocity dispersion into the external resonator, and to provide the spectral filtering after the external resonator, wherein the dispersion compensation optical system is selected from the group consisting of
(a) a system including a diffraction grating, a condensing lens, and a reflection mirror;
(b) a system including first and second diffraction gratings, and a partial reflection mirror;
(c) a system including first and second prisms, and a partial reflection mirror, and
(d) a system including an interferometer,
wherein a combination of the dispersion compensation system and the mode-locked semiconductor laser device allows generation of an optical pulse at a pulse time width level on order of 200 femtoseconds or less.

18. The method of claim 17, wherein the mode-locked semiconductor laser device is a bisectional laser device.

19. The method of claim 17, wherein the mode-locked semiconductor laser device includes a laminate structure including a plurality of semiconductor layers, wherein at least one of the semiconductor layers is associated with at least one emission region and at least one saturable absorption region, and wherein the at least one emission region and the at least one saturable absorption region are arranged in parallel in a direction of the external resonator.

20. The method of claim 17, wherein the external resonator includes a first end surface of the mode-locked semiconductor laser device, and at least one of a reflection mirror and a partial reflection mirror.

* * * * *